(12) United States Patent
Deering et al.

(10) Patent No.: US 11,019,689 B2
(45) Date of Patent: May 25, 2021

(54) LENS HEATING SYSTEMS AND METHODS FOR AN LED LIGHTING SYSTEM

(71) Applicant: J.W. SPEAKER CORPORATION, Germantown, WI (US)

(72) Inventors: Eric Deering, Hartland, WI (US); Peter Andrew Zagar, Hartford, WI (US); Bradley William Kay, Mequon, WI (US); Dragoslav Popovic, Germantown, WI (US)

(73) Assignee: J.W. SPEAKER CORPORATION, Germantown, WI (US)

( * ) Notice: Subject to any disclaimer, the term of this patent is extended or adjusted under 35 U.S.C. 154(b) by 0 days.

(21) Appl. No.: 16/441,514

(22) Filed: Jun. 14, 2019

(65) Prior Publication Data

US 2019/0306926 A1   Oct. 3, 2019

Related U.S. Application Data

(63) Continuation-in-part of application No. 15/182,994, filed on Jun. 15, 2016, now Pat. No. 10,364,954.

(60) Provisional application No. 62/175,542, filed on Jun. 15, 2015.

(51) Int. Cl.
| | | |
|---|---|---|
| H05B 3/84 | (2006.01) | |
| F21V 29/90 | (2015.01) | |
| H05K 1/02 | (2006.01) | |
| F21S 45/60 | (2018.01) | |

(52) U.S. Cl.
CPC ............... H05B 3/84 (2013.01); F21S 45/60 (2018.01); F21V 29/90 (2015.01); H05K 1/0274 (2013.01)

(58) Field of Classification Search
CPC ........ H05B 3/84; F21V 29/90; H05K 1/0274; F21S 45/60
See application file for complete search history.

(56) References Cited

U.S. PATENT DOCUMENTS

| | | | |
|---|---|---|---|
| 5,090,122 A | 2/1992 | Kitagawa | |
| 6,465,951 B1 | 10/2002 | Krafcik et al. | |
| 6,476,358 B1 | 11/2002 | Lang et al. | |
| 6,641,860 B1 | 11/2003 | Kaiserman et al. | |
| 7,347,382 B2 | 3/2008 | Ferber et al. | |
| 7,489,053 B2 | 2/2009 | Gentile et al. | |
| 7,594,442 B2 | 9/2009 | Kaiserman et al. | |
| 8,008,606 B2 * | 8/2011 | Kaiserman | A43B 7/04 219/520 |
| 8,169,684 B2 | 5/2012 | Bugno et al. | |

(Continued)

FOREIGN PATENT DOCUMENTS

| | | |
|---|---|---|
| EP | 0408853 A2 | 1/1991 |
| EP | 2196732 A1 | 6/2010 |

(Continued)

OTHER PUBLICATIONS

European Patent Office, Extended European Search Report, Application No. 16812296.8, dated Jun. 3, 2019, 9 pages.

(Continued)

*Primary Examiner* — Evan P Dzierzynski
(74) *Attorney, Agent, or Firm* — Quarles & Brady LLP

(57) ABSTRACT

Systems and methods for lighting system lens heating are described. The systems and methods include a substantially clear thermoplastic substrate; and a conductive ink or film circuit on the thermoplastic substrate.

21 Claims, 32 Drawing Sheets

(56) References Cited

U.S. PATENT DOCUMENTS

| | | |
|---|---|---|
| 8,431,868 B1 | 4/2013 | Akin |
| 8,441,156 B2 | 5/2013 | Boss et al. |
| 8,680,440 B2 | 3/2014 | Cohen et al. |
| 8,998,458 B2 | 4/2015 | Tankala et al. |
| 9,210,737 B2 | 12/2015 | Cornelius |
| 10,144,337 B1 | 12/2018 | Salter et al. |
| 2003/0002179 A1 | 1/2003 | Roberts et al. |
| 2005/0007406 A1 | 1/2005 | Haas et al. |
| 2005/0194454 A1 | 9/2005 | Ferber et al. |
| 2006/0001727 A1 | 1/2006 | Haas et al. |
| 2006/0060576 A1 | 3/2006 | Haas et al. |
| 2006/0109074 A1 | 5/2006 | Lee et al. |
| 2006/0157462 A1 | 7/2006 | Weiss et al. |
| 2006/0292938 A1 | 12/2006 | Schwenke et al. |
| 2008/0180779 A1 | 7/2008 | McCabe et al. |
| 2010/0072416 A1 | 3/2010 | Fujioka et al. |
| 2012/0228240 A1 | 9/2012 | Gentile et al. |
| 2013/0114279 A1 | 5/2013 | Marley |
| 2013/0323548 A1 | 12/2013 | Iwamoto |
| 2014/0036428 A1 | 2/2014 | Leong et al. |
| 2014/0111469 A1 | 4/2014 | Foerster et al. |
| 2014/0217242 A1* | 8/2014 | Muren .................. A63H 27/12 244/4 R |
| 2014/0262722 A1* | 9/2014 | Haag .................. H03K 17/962 200/600 |
| 2014/0332518 A1 | 11/2014 | Lesmeister et al. |
| 2015/0023023 A1 | 1/2015 | Levesay et al. |
| 2015/0048161 A1 | 2/2015 | Gentile et al. |
| 2015/0054417 A1 | 2/2015 | Lee |
| 2015/0055363 A1 | 2/2015 | Van Straten |
| 2016/0046262 A1 | 2/2016 | Van Straten |
| 2016/0052366 A1 | 2/2016 | Hoke et al. |
| 2016/0215952 A1 | 7/2016 | Dunn et al. |
| 2017/0234503 A1 | 8/2017 | Buffone et al. |

FOREIGN PATENT DOCUMENTS

| | | |
|---|---|---|
| JP | 2007242292 A | 9/2007 |
| JP | 2008181707 A | 8/2008 |
| JP | 2010165609 A | 7/2010 |
| WO | 2000055685 A | 9/2000 |
| WO | 2007022027 A2 | 2/2007 |

OTHER PUBLICATIONS

PCT/US16/37538; Search Report and Written Opinion; dated Sep. 8, 2016; 18 pages.

European Patent Office, Extended European Search Report, Application No. 19180227.1, dated Dec. 5, 2019, 11 pages.

* cited by examiner

| INK TYPE | 1. 47955 | | | 2. SUN 3818-136B | | | 3. SUN AST 6010 | | |
|---|---|---|---|---|---|---|---|---|---|
| MATERIAL TYPE | PC-0100 | PC-0250 | PC-0280 | PC-0100 | PC-0250 | PC-0280 | PC-0100 | PC-0250 | PC-0280 |
| 1 | 22.1 | 23.3 | 23.4 | 24.1 | 28.6 | 28.9 | 9.7 | 9.8 | 10.5 |
| 2 | 21.7 | 29 | 22.7 | 36.8 | 43 | 41.6 | 10.1 | 10 | 10.9 |
| 3 | 22.4 | 23.1 | 23.3 | 36.6 | 29 | 28.2 | 9.6 | 9.7 | 9.4 |
| 4 | 22.3 | 22.6 | 23.4 | 25.8 | 47.6 | 40.2 | 9.8 | 10.1 | 9.6 |
| 5 | 22.7 | 22.7 | 23.3 | 25.4 | 28.3 | 29.1 | 9.8 | 9.8 | 10 |
| 6 | 22.5 | 22.3 | 22.7 | 33.8 | 50 | 40.8 | 9.2 | 9.5 | 10.4 |
| 7 | 22.5 | 23.4 | 22.4 | 25.3 | | 39.4 | 9.6 | | |
| 8 | 22.2 | 23.4 | | 33.8 | | 28.7 | 10 | | |
| 9 | | | | | | 28.1 | | | |
| 10 | | | | | | 41.1 | | | |

RESISTANCE MEASURED IN OHMS
 =DIELECTRIC APPLIED TO CIRCUIT

|  | WITH CONDUCTIVE TRACE HEATER | WITHOUT CONDUCTIVE TRACE HEATER | % DECREASE |
| --- | --- | --- | --- |
| HIGH BEAM LUMENS | 775 LUMENS | 897 LUMENS | 13.6% |
| LOW BEAM LUMENS | 546 LUMENS | 634 LUMENS | 13.9% |
| HIGH BEAM MAXIMUM INTENSITY | 34156 CANDELA | 38974 CANDELA | 12.4% |
| LOW BEAM MAXIMUM INTENSITY | 18180 CANDELA | 20179 CANDELA | 9.9% |

FIG. 20

LENS HEATING SYSTEMS AND METHODS FOR AN LED LIGHTING SYSTEM

CROSS-REFERENCE TO RELATED APPLICATIONS

This application is a continuation-in-part of U.S. patent application Ser. No. 15/182,994 filed Jun. 15, 2016, which claims the benefit of U.S. Provisional Application No. 62/175,542, filed Jun. 15, 2015, and is incorporated herein by reference.

STATEMENT OF FEDERALLY SPONSORED RESEARCH OR DEVELOPMENT

Not applicable.

FIELD OF THE TECHNOLOGY

The present technology relates to an LED lighting system. More particularly, the technology relates to systems and methods for providing an LED lighting system lens heater.

BACKGROUND

Most vehicles include some form of a vehicle headlamp and tail lamp, and other lighting systems. Lighting systems that use incandescent or HID bulbs, for example, generate sufficient radiation, particularly in the non-visible spectrum, so that in colder conditions, moisture in the form of condensation, rain, sleet, or snow does not form ice on the lighting system, which would reduce optical transmission of the lighting system lens. Some lights that use LEDs for illumination do not generate sufficient radiation to melt snow and ice from the lighting system lens.

Therefore, what is needed are improved systems and methods that sufficiently heat a lighting system lens to melt snow and ice to avoid reducing optical transmission of the lighting system lens.

BRIEF SUMMARY OF THE TECHNOLOGY

The present technology provides lighting system lens heating systems and methods.

In one form, the technology provides a system for heating a lens of a LED lighting system.

In another form, the technology provides a method of heating a LED lighting system.

In accordance with one embodiment of the technology, a system for heating the lens of a lighting system is disclosed. The system comprises a substantially clear thermoplastic substrate; and a conductive ink or film circuit on the thermoplastic substrate.

In some embodiments, the heating system further includes a lens heater circuit, with a lens heater controller operatively coupled to the lens heater circuit.

In some embodiments, the conductive ink circuit is screen printed on the thermoplastic substrate.

In some embodiments, the conductive ink circuit is a conductive silver trace.

In some embodiments, the conductive film circuit is a conductive silver trace.

In some embodiments, a heating output of the conductive ink circuit is regulated based upon the temperature of the conductive ink circuit utilizing a positive temperature coefficient (PTC) ink trace.

In some embodiments, the heating system further includes a dielectric top coating on the conductive ink circuit.

In some embodiments, the conductive ink circuit has a resistance in the range of about 5 ohms to about 300 ohms.

In some embodiments, the conductive ink circuit includes traces that are generally equal length.

In some embodiments, the traces are connected with a busbar on a non-power connect side.

In some embodiments, the traces have a width in the range of about 0.05 mm to about 1.0 mm.

In some embodiments, the conductive ink circuit produces about 1 W/in 2.

In some embodiments, the conductive ink circuit is a substantially transparent ink.

In some embodiments, the lens heater controller regulates the conductive ink circuit voltage to increase or decrease the power being dissipated by the conductive ink circuit.

In some embodiments, the heating system further includes a lighting system lens, wherein the conductive ink circuit remains exposed on the inside of the lighting system lens.

In accordance with another embodiment of the technology, an LED lighting system assembly having a heated lens is disclosed. The assembly comprises a housing, the housing including a base and a lens, the lens having a interior lens side and an exterior lens side; at least one LED positioned within the base to provide illumination through the lens; a lens heater controller; a lens heater circuit operatively coupled to the lens heater controller; a substantially clear thermoplastic substrate positioned on the interior lens side; and a conductive ink or film circuit on the thermoplastic substrate operatively coupled to the lens heater circuit.

In some embodiments, the conductive ink on the thermoplastic substrate is placed into a pocket on a core of an injection molding tool with the conductive ink side against the core, and the conductive ink side remains exposed on a final lighting system lens part.

In some embodiments, the conductive ink on the thermoplastic substrate is placed against a cavity side of an injection molding tool, with the conductive ink side encapsulated between the thermoplastic substrate and a final lighting system lens part.

In some embodiments, a thermoplastic resin then over molds the thermoplastic substrate, bonding only to the non-printed side of the thermoplastic substrate.

In some embodiments, the injection molding tool uses vacuum to recess and hold the thermoplastic substrate in the core.

In some embodiments, greater than 90 percent transmission rate in terms of both lumens and intensity is achieved.

In accordance with another embodiment of the technology, a method for heating a lens of a lighting system is disclosed. The method can include applying a conductive ink or film circuit on a substantially clear thermoplastic substrate; applying the conductive ink or film circuit on the substantially clear thermoplastic substrate to at least one of an interior lens side and an exterior lens side; and applying a controlled power to the conductive ink or film circuit to heat the lens.

In some embodiments, the method further includes applying a PTC trace near the conductive ink or film circuit; sensing the resistance of the PTC trace; and controlling the power to the conductive ink or film circuit based on the sensed resistance of the PTC trace.

In accordance with another embodiment of the technology, a lens heating system is disclosed. The lens heating system can include a substantially clear thermoplastic substrate, and a conductive ink or film circuit, positioned on the thermoplastic substrate to heat the thermoplastic substrate. The lens heating system can further include a lens heater circuit including a lens heater and operatively coupled to a lens heater controller. The controller can be configured to determine a temperature associated with an outer lens surface, and activate the lens heater in response to a determination that the temperature is less than or equal to a threshold temperature. The lens heating system can further include a spring connector including a plurality of pins, the pins configured to couple to the conductive ink or film circuit, and the pins further configured to provide an electrical connection between the pins and the conductive ink or film circuit.

In some embodiments, the controller can be coupled to a thermistor, the thermistor configured to determine the temperature associated with the outer lens surface.

In some embodiments, the thermistor can be a negative temperature coefficient (NTC) thermistor.

In some embodiments, the spring connectors can be positioned at least partially within a lens coupled to the substantially clear thermoplastic substrate.

In some embodiments, the lens heater circuit can include a circuit board, the spring connector being surface-mounted to the circuit board.

In some embodiments, the system can further include a second spring connector coupled to a second busbar of the conductive ink or film circuit, the spring connector coupled to a first busbar of the conductive ink or film circuit.

In accordance with another embodiment of the technology, a method for heating a lens of a lighting system is disclosed. The method can include applying a conductive ink or film circuit on a substantially clear thermoplastic substrate, and applying the conductive ink or film circuit on the substantially clear thermoplastic substrate to at least one of an interior lens side and an exterior lens side. The method can further include positioning a spring connector having a plurality of pins against the conductive ink or film circuit, and establishing an electrical connection between the pins and the conductive ink or film circuit, and applying a controlled power to the conductive ink or film circuit to heat the lens.

In some embodiments, the positioning can include moving the spring connector towards the conductive ink or film circuit until the pins have flexed a predetermined amount corresponding to establishing the electrical connection.

In some embodiments, the method can further include receiving a value from a wireless module and supplying power to the conductive ink or film circuit based on the value.

In some embodiments, the method can further include receiving a value from a speed sensor, determining the speed value is above a predetermined threshold, and supplying, in response to determining the speed value is below the predetermined threshold, a predetermined amount of power to the conductive ink or film circuit.

In some embodiments, the method can further include receiving a value from an optical sensor, determining the optical value is below a predetermined threshold; and supplying, in response to determining the optical value is below the predetermined threshold, a predetermined amount of power to the conductive ink or film circuit.

In some embodiments, the method can further include positioning the spring connector at least partially within the lens coupled to the substantially clear thermoplastic substrate.

In accordance with another embodiment of the technology, a heated lighting system is provided. The system can include a substantially clear thermoplastic substrate, a conductive ink or film circuit, positioned on the thermoplastic substrate to heat the thermoplastic substrate, a lens in contact with the thermoplastic substrate, and an interconnect assembly including a plurality of spring connectors. The spring connectors can be positioned in contact with the conductive ink or film circuit, and the interconnect assembly can be positioned at least partially within the lens.

In some embodiments, the interconnect assembly can be configured to supply power to the conductive ink or film circuit.

In some embodiments, the lens can be bonded to at least a portion of the interconnect assembly and at least a portion of the thermoplastic substrate.

In some embodiments, the conductive ink or film circuit can be positioned on an exterior surface of the lens.

In some embodiments, the lens can be constructed from a thermoplastic polymer.

In accordance with another embodiment of the technology, a method for manufacturing a heated lighting system is disclosed. The method can include applying a conductive ink or film circuit on a substantially clear thermoplastic substrate, positioning the thermoplastic substrate in a cavity of an injection molding tool, and positioning an interconnect assembly in a pocket of a core of the injection molding tool. The method can further include positioning the interconnect assembly against the thermoplastic substrate to establish an electrical connection between the interconnect assembly and the thermoplastic substrate, and injecting a resin into the injection molding tool. The interconnect assembly can be configured to supply power to the conductive ink or film circuit via the electrical connection.

In some embodiments, the interconnect assembly can include a plurality of pins and the positioning of the interconnect assembly against the thermoplastic substrate can include flexing the plurality of pins against the conductive ink or film circuit.

In some embodiments, injecting the resin into the injection molding tool can include overmolding at least a portion of the interconnect assembly and at least a portion of the conductive ink or film circuit.

In some embodiments, positioning the thermoplastic substrate in the cavity can include positioning the conductive ink or film circuit to face away from the cavity.

These and other benefits may become clearer upon making a thorough review and study of the following detailed description. Further, while the embodiments discussed above can be listed as individual embodiments, it is to be understood that the above embodiments, including all elements contained therein, can be combined in whole or in part.

BRIEF DESCRIPTION OF THE DRAWINGS

The invention will be better understood and features, aspects and advantages other than those set forth above will become apparent when consideration is given to the following detailed description thereof. Such detailed description makes reference to the following drawings.

FIG. 20 is a table showing the optical impact of the lens heater traces on low beam illumination and hi beam illumination.

Figure 1:
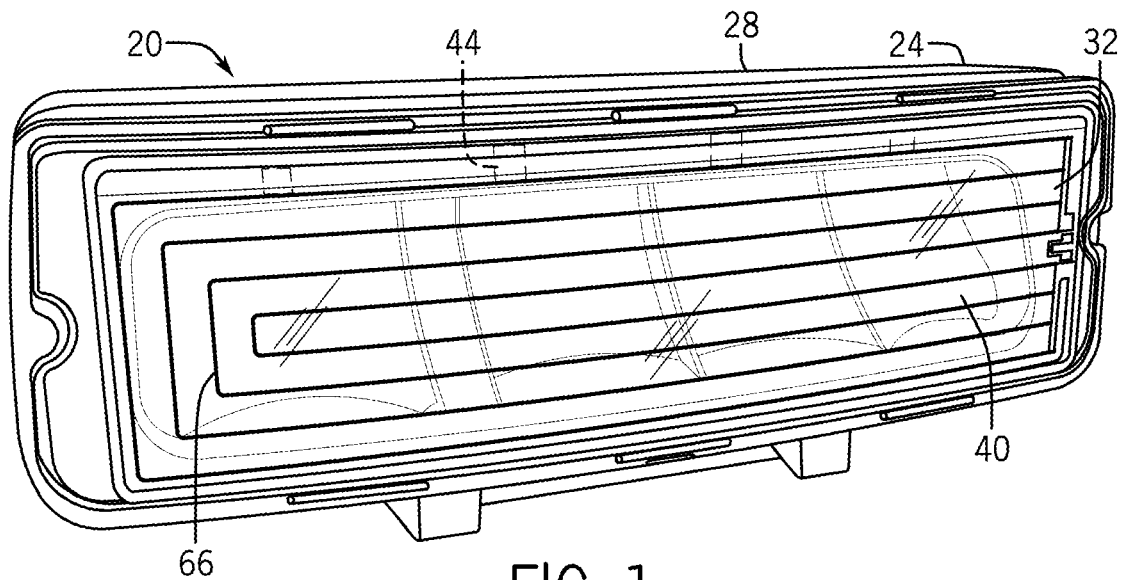
FIG. 1 is a perspective view of a lighting system with a lens heater in accordance with embodiments of the present invention.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above, except where different specific meanings have otherwise been set forth herein.

DETAILED DESCRIPTION OF THE TECHNOLOGY

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the use the phraseology and terminology used herein is for the purpose of description and should not be regarded as limiting. Furthermore, the use of "right", "left", "front", "back", "upper", "lower", "above", "below", "top", or "bottom" and variations thereof herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Figure 2:
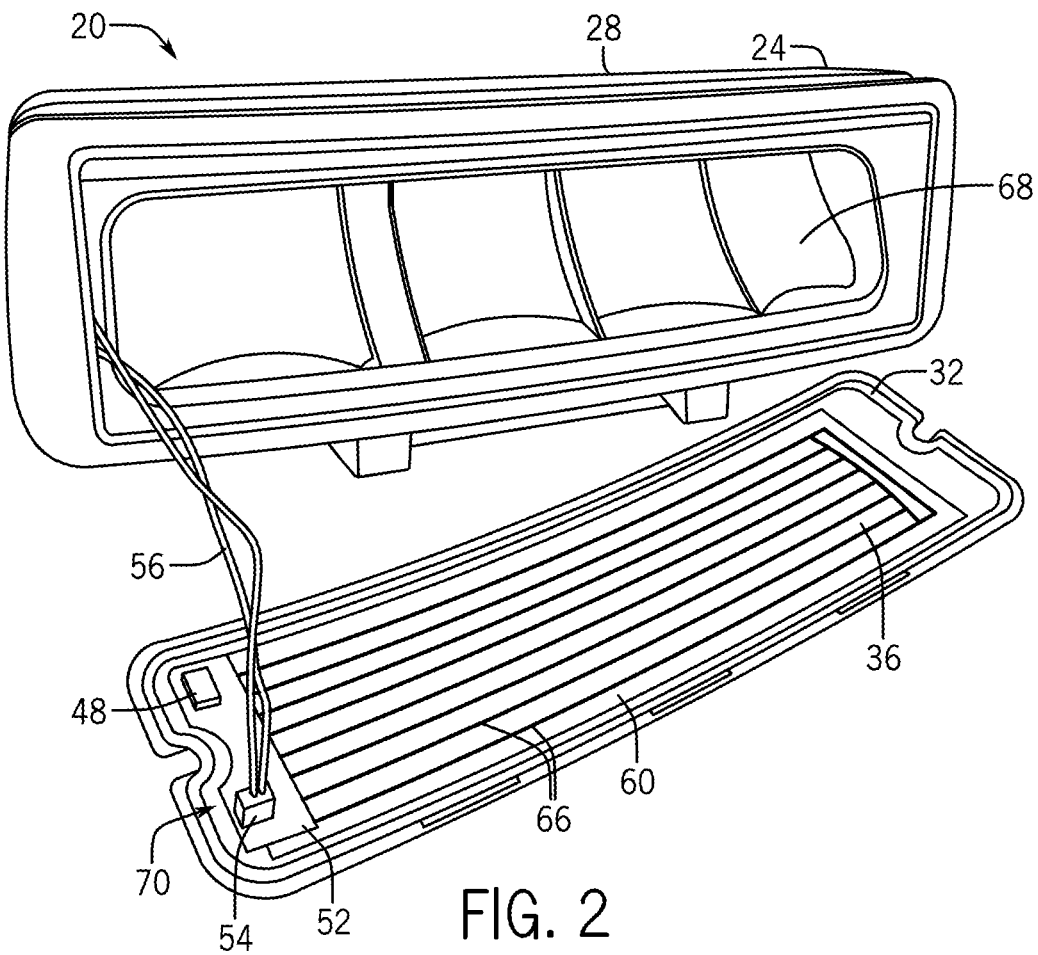
FIG. 2 is a perspective view of the lighting system of FIG. 1, with the lens removed.

A high optical transmission lens heater is needed to prevent icing of certain LED lighting systems. Referring to FIGS. 1 and 2, in some embodiments, an over molded screen printed conductive circuit can be used as the heating element for a lighting system 20. The lighting system 20 can include a housing 24, with the housing including a base 28 and a lens 32. The lens 32 has an interior lens side 36 and an exterior lens side 40. At least one LED 44 can be positioned within the base 28 to provide illumination through the lens 32. A lens heater assembly 70 can include a lens heater controller 48, with a lens heater circuit 52 operatively coupled to the lens heater controller 48. In some embodiments, a substantially clear thermoplastic substrate 60 can be positioned on the interior lens side 36 of the lens, and a conductive ink or film circuit 66 can be positioned on the thermoplastic substrate 66 and can be operatively coupled to the lens heater circuit 52. In some embodiments, a reflector 68 can be included to guide illumination from the one or more LEDs 44.

In some embodiments, the heating output of the heating element can be regulated based upon the temperature of the heating element traces utilizing a positive temperature coefficient (PTC) ink trace.

Figure 3:
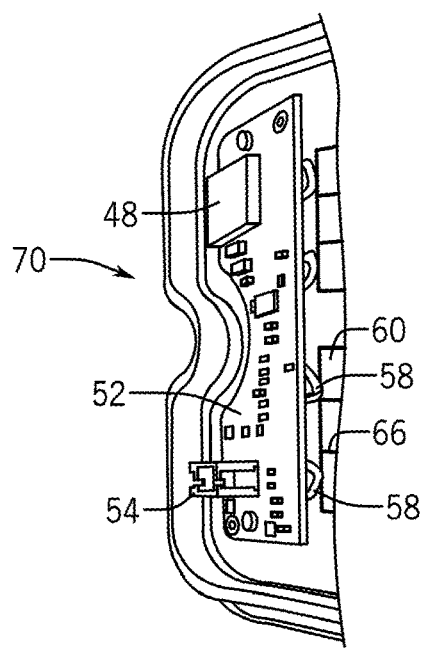
FIG. 3 is a perspective view of a portion of a lens heater assembly in accordance with embodiments of the present invention.

FIG. 3 shows an embodiment of the lens heater circuit 52. The lens heater circuit 52 can be coupled to the lens 32, or can be positioned within the base 28. When the lens heater circuit is coupled to the lens 32, as shown in FIG. 3, power wires 56 (see FIG. 2) can extend from the base and couple to a connector 54 on the lens heater circuit. In some embodiments, a conductive element 58 can be used to provide power from the lens heater circuit 52 to the conductive ink circuit 66. The conductive element can be a spring or a wire, for example.

Figure 4:
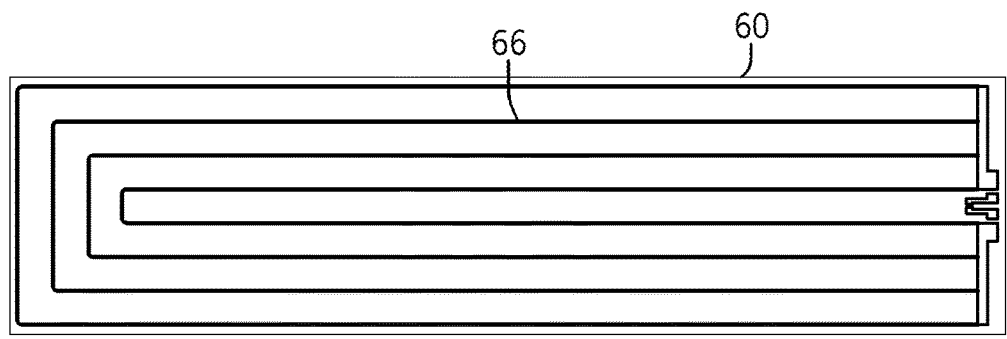
FIG. 4 is a schematic of a conductive ink or film circuit that can be used as a heating element in accordance with embodiments of the present invention.
Figure 5:
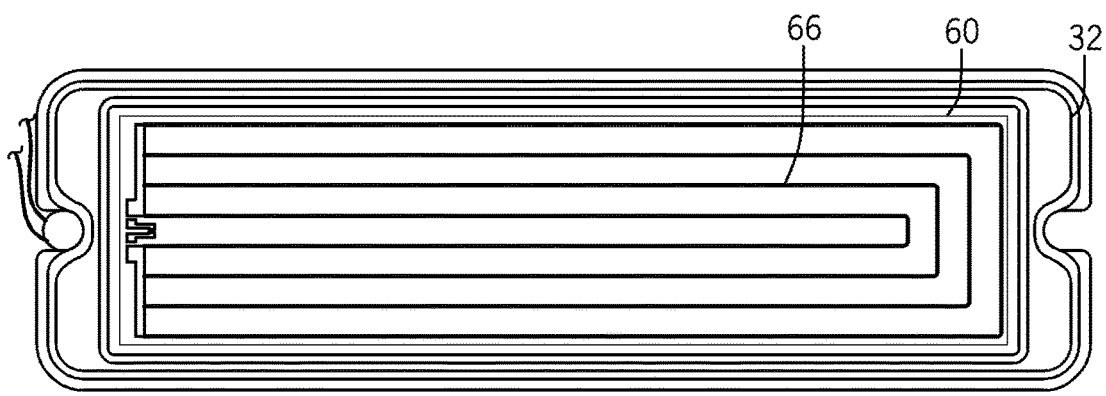
FIG. 5 is a schematic of the conductive ink or film of FIG. 4, and attached to a lens of a light.

FIGS. 4 and 5 show embodiments of a conductive ink or film circuit 66 that can be used as the heating element. It is to be appreciated that the terms ink and film are used interchangeably herein. In some embodiments, the conductive film 66 is a conductive silver trace. It is to be appreciated that other resistive elements can be used for the conductive film. FIG. 4 shows the conductive silver traces that have been screen printed on the clear substrate films 60. In some embodiments the substrate 60 can be a thermoplastic polymer. In some embodiments, the substrate 60 can be a polycarbonate substrate. Again, other substrate materials can be used. FIG. 5 shows the conductive film 66 on the substrate 60 preliminarily attached to the lighting system lens 32 for testing. The substrate 60 could be any clear or substantially clear substrate film. Opaque substrate can also be used.

Figure 6:
FIG. 6 is a table showing resistance repeatability data for various configurations.

An embodiment of the lens heater assembly 70 was tested using multiple types of inks with and without a dielectric top coating. The lens heater assembly 70 was also tested on multiple substrate thicknesses. FIG. 6 shows resistance repeatability data for the various configurations. In some embodiments, the lens heater circuit 52 can have a resistance in the range of about 5 ohms to about 300 ohms, depending upon the application. Some 12-24V lighting system applications may be around 30 ohms, or more or less. Other voltages and resistances are contemplated.

Figure 7:
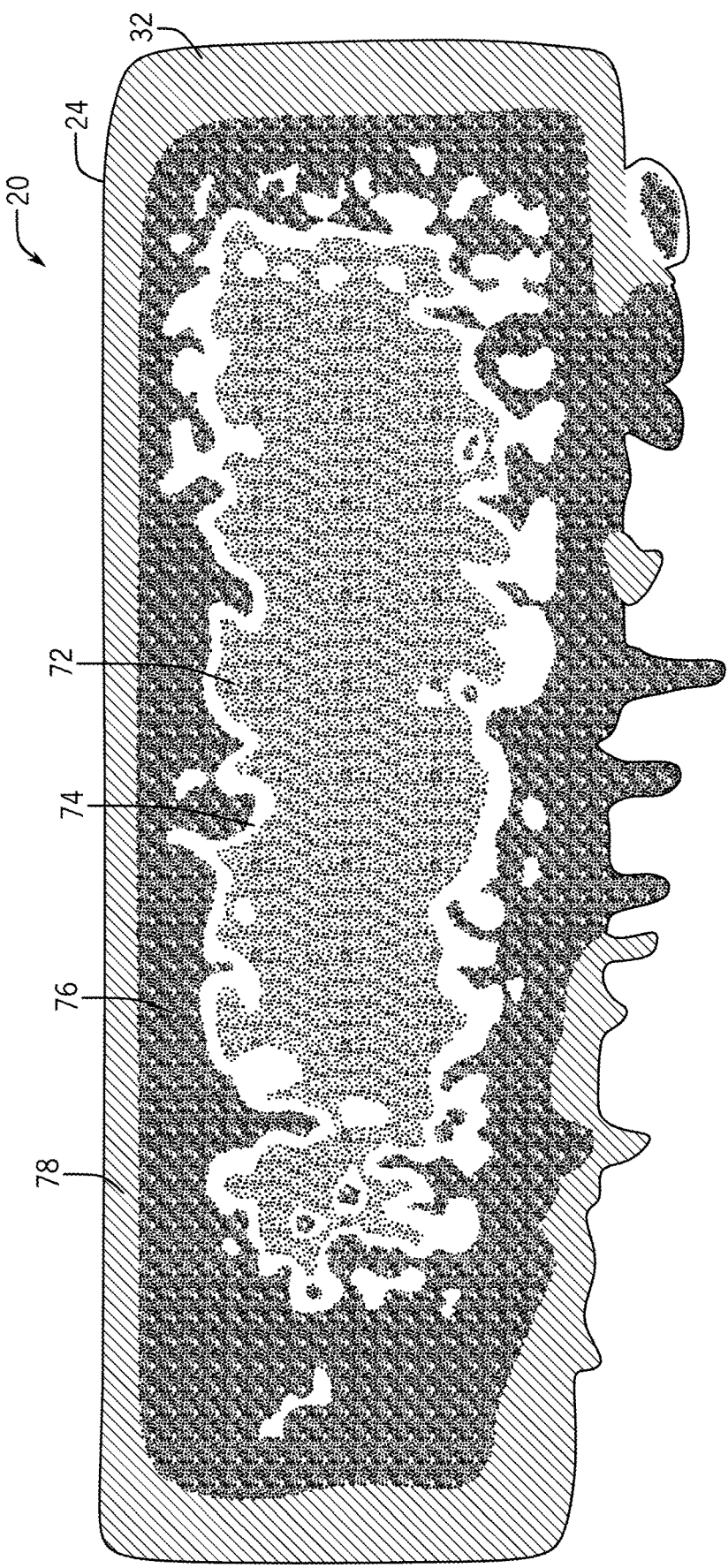
FIG. 7 is a view showing a thermal image of a lighting system with the lens heater assembly energized, in accordance with embodiments of the present invention.
Figure 8:
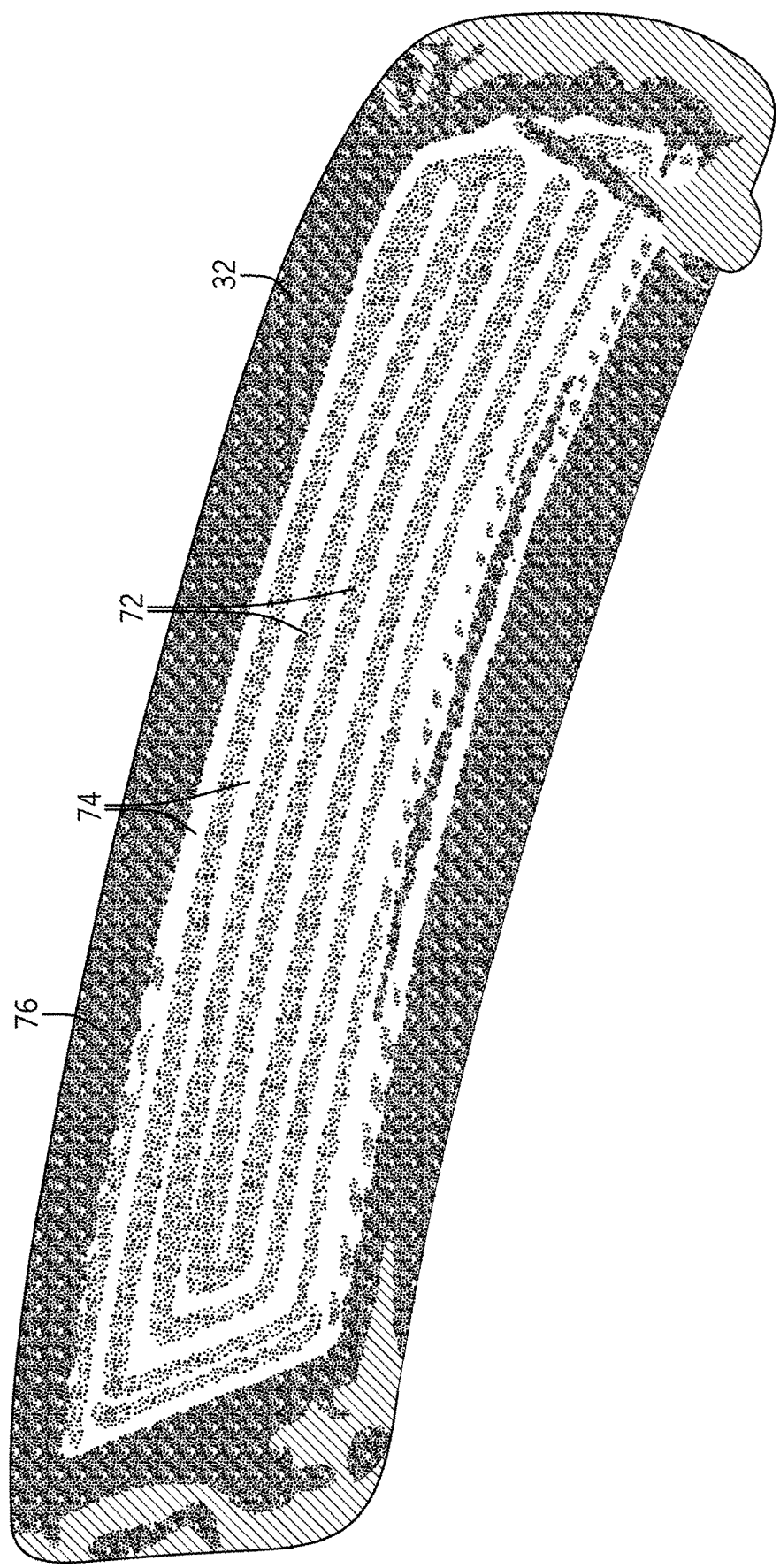
FIG. 8 is a view showing a thermal image of just the lens of a lighting system with the lens heater assembly energized, in accordance with embodiments of the present invention.

A version of the lens heater assembly 70 was taped to an existing molded outer lens 32 and thermal testing was completed on the stand alone lens 32 as well as the lamp assembly. FIGS. 7 and 8 show thermal images of the lighting system assembly 20 (FIG. 7) and just the lens 32 (FIG. 8) and with the lens heater assembly energized. In the figures, temperature is represented by 72 being hot, 74 being warm, 76 being cool, and 78 being cold. It is to be appreciated that these descriptions of hot, warm, cool, and cold are relative terms, and are only intended to show a gradient of temperature ranges that can be produced by the lighting system 20.

Figure 9:
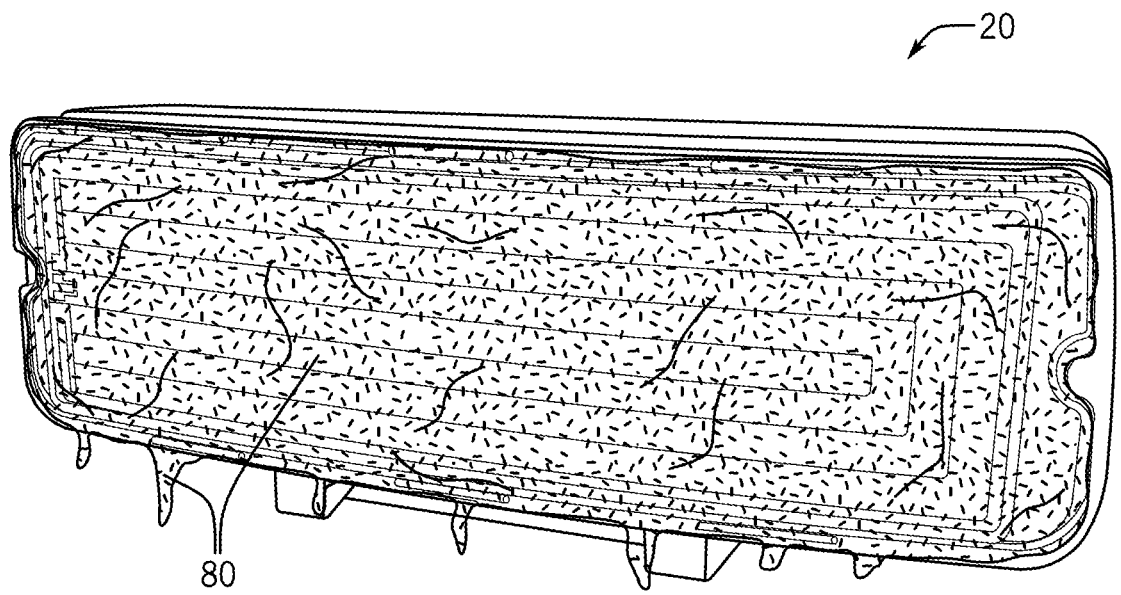
FIG. 9 is a perspective view of a lighting system with approximately 2 mm of ice buildup.
Figure 10:
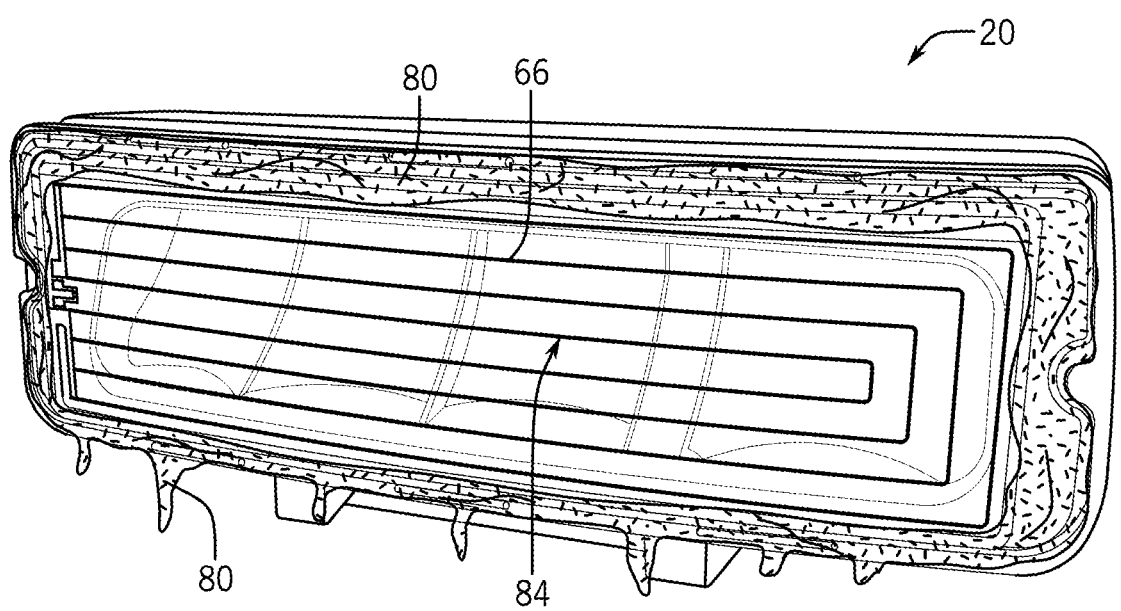
FIG. 10 is a perspective view of the lighting system of FIG. 9 with the lens heater circuit energized and with the ice substantially clear from the optical area.

FIG. 9 shows a lighting system 20 in a cooling chamber saturated at −20 C with approximately 2 mm of ice buildup 80. FIG. 10 then shows the same lighting system 20 with LEDs 44 energized, e.g., low beam and hi beam, along with the lens heater circuit 52 energized and dissipating approximately 18 watts. Ice 80 was substantially cleared from the optical area 84 in several minutes. The cooling chamber remained at −20 C with considerable convective airflow.

Figure 11:
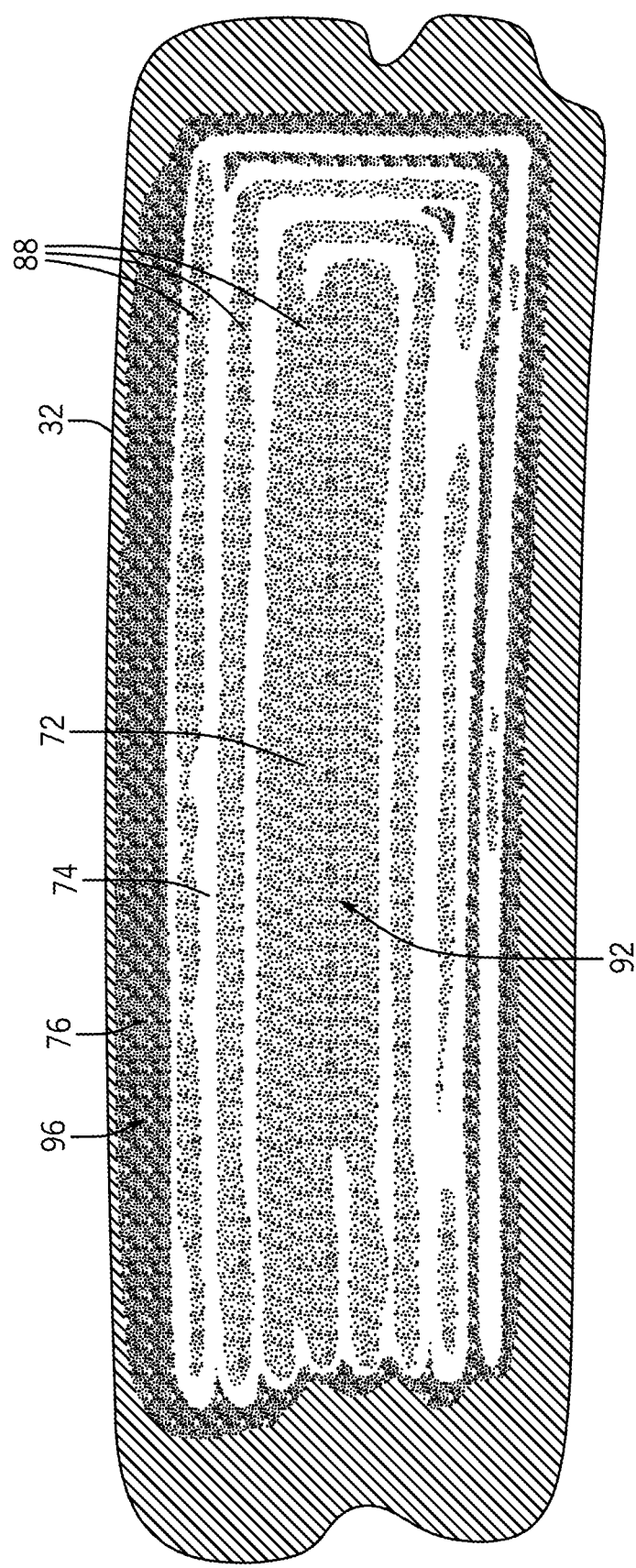
FIG. 11 is a view showing an alternative embodiment having a lens heater circuit made up of traces with generally unequal trace lengths.
Figure 12:
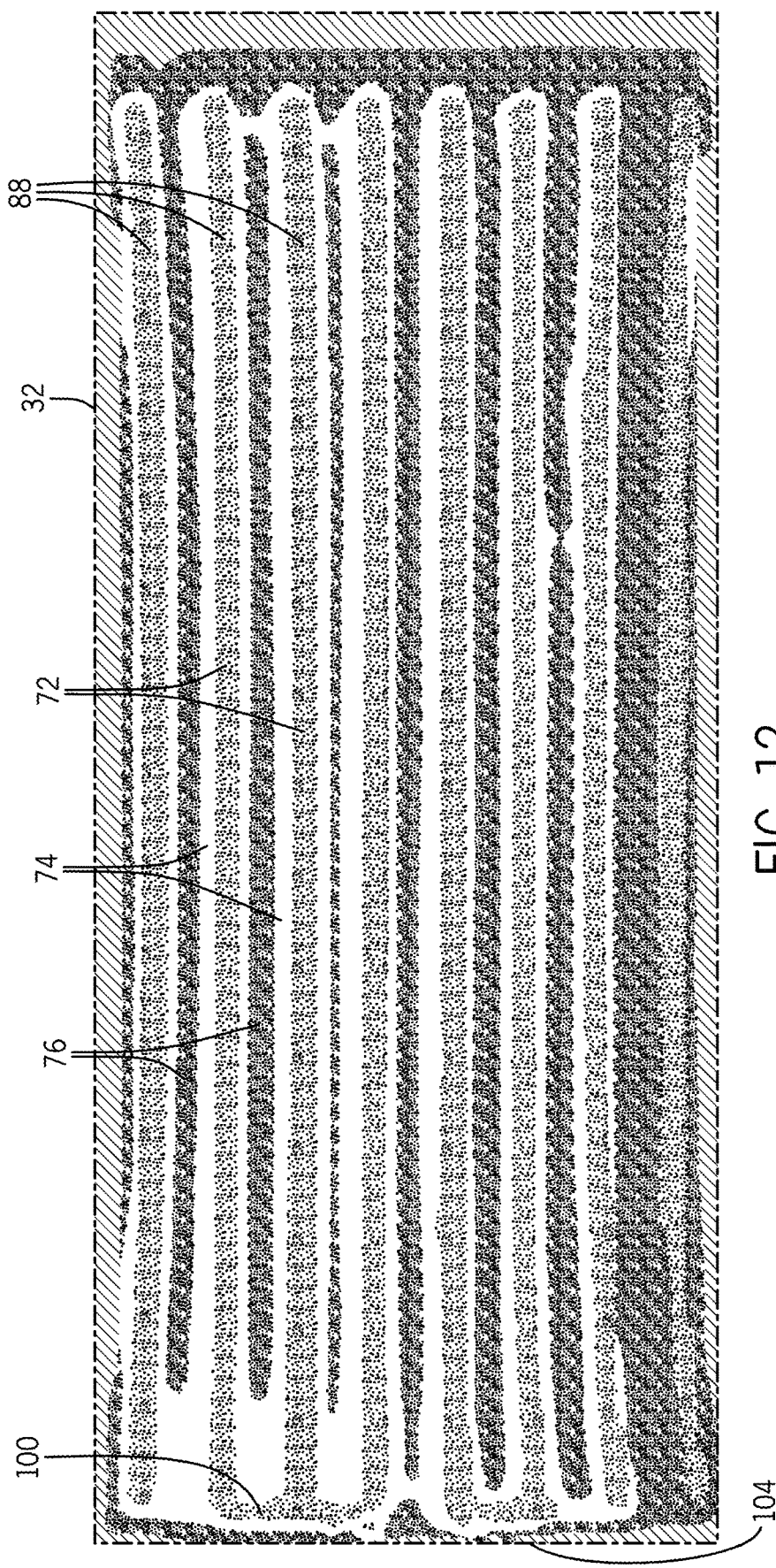
FIG. 12 is a view showing an alternative embodiment having a lens heater circuit made up of traces with generally equal trace lengths.

FIG. 11 shows one embodiment having a lens heater circuit 52 made up of traces 88 with unequal trace lengths. This arrangement created non-uniform heating of the traces 88. This arrangement may be useful for certain applications. Slightly warmer heating in the center 92 can be seen as compared to the edges 96. FIG. 12 shows an additional embodiment with generally equal length traces 88. A more uniform heating can be seen. The traces can be connected with a busbar 100 on the non-power connect end 104 to allow for equal trace lengths, which can also be useful in certain applications. In the figures, temperature is represented by 72 being hot, 74 being warm, 76 being cool, and 78 being cold. It is to be appreciated that these descriptions of hot, warm, cool, and cold are relative terms, and are only intended to show a gradient of temperature ranges that can be produced by the lighting system 20.

In some embodiments, a silver based screen printable ink can be used as the lens heater traces 88. Silver allows for low resistance traces even when the traces are very thin. In some embodiments, the ink can be printed at a thickness between about 5-15 micrometers (could vary more or less than this in other embodiments). Other conductive inks could be utilized provided they can meet the overall resistance requirements for various applications.

In some embodiments, the width of the lens heater traces used as heating elements can be about 0.35 mm. This can vary from about 0.05 mm to about 1.0 mm on various embodiments. The lens heater traces can be spaced at approximately 8 mm to provide uniform heating of the entire lens surface. This distance can be increased to approximately 15 mm and still be effective, and can be reduced for other applications. It is to be appreciated that other dimensions are possible.

In some embodiments, the overall resistance of the lens heater circuit 52 can be about 30 ohms. In other embodiments, this can vary from about 5 ohms to about 300 ohms in various designs.

Through testing, it has been found that approximately 1 W/in$^2$ applied to the internal surface of a thermoplastic polymer outer lens 32 can be an adequate amount of power per optical area of an LED lamp to effectively de-ice. In other embodiments, this could be increased to 2 W/in$^2$ or more on other designs. Some embodiments of the lighting system 20 can be designed around a dissipation of about 18 Watts. It is to be appreciated that other dissipations are possible.

In other embodiments, the lens heater portion may not necessarily need to be opaque traces of a conductive ink. The lens heater traces 88 could be a substantially transparent ink, for example, (e.g., approximately 85 percent, or more or less, transmission), that can cover a portion or the entire surface of the heater substrate 60. This transparent ink may also include a more conductive ink screen over it to create busbars and input power connection points. Non-limiting examples of clear conductive ink include those based on carbon or graphite nanotechnology, silver micro or nano structures, as well as indium tin oxide, silver or copper micro foil grids.

Figure 13:
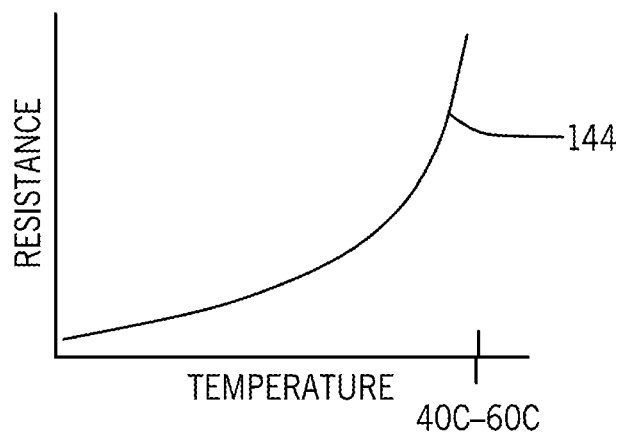
FIG. 13 is a graph showing a key characteristic of PTC inks.

As mentioned above, PTC ink traces 108 may also be incorporated into the lens heater circuit 52. FIG. 13 is a graph that shows a key characteristic of PTC inks. As the temperature increases so does the resistance of the PTC ink. At a certain predetermined temperature, the increase in resistance can become exponential. In some embodiments, a PTC trace 108 can be located near one or more of the lens heater traces 88. In some embodiments, when the lens heater trace 88 approaches about 40 C-60 C, the PTC trace resistance can go to infinity. A lens heater controller 48 can recognize this change in resistance and vary voltage supplied to the lens heater circuit 52 to keep the lens heater trace 88 at or near about 40 C during operation. In some embodiments, a 40 C PTC ink offered by Henkel AG & Company, KGaA, can be used. PTC inks from Dupont and others can also be used.

Figure 14:
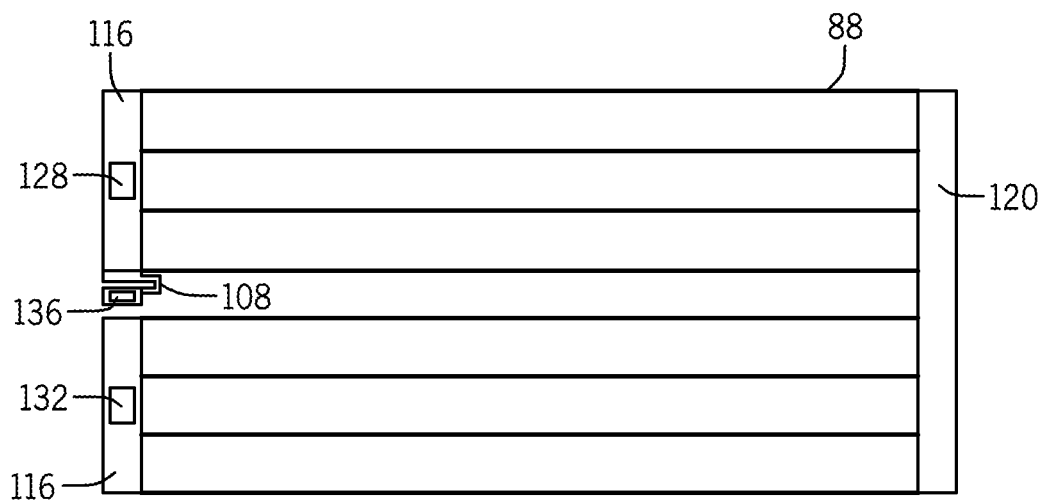
FIG. 14 is a schematic view showing an embodiment of a lens heater assembly layout (without the lens heater circuit) and with the PTC trace for temperature sensing.

FIG. 14 shows an embodiment of a lens heater assembly 70 layout (without the lens heater circuit 52) and with the PTC trace 108 for temperature sensing. With the opposing busbar 120, in some embodiments, most or all traces can be substantially equal length and can heat uniformly. There can be multiple connection points (could have more than one connection per power busbar 116 to reduce current traveling through a single point). The top connection point 128 and bottom connection point 132 support the potential across the lens heater traces 88. The top 128 and center 136 connection points allow for measurement of resistance across the PTC trace 108 serving as a thermistor.

Figure 15:
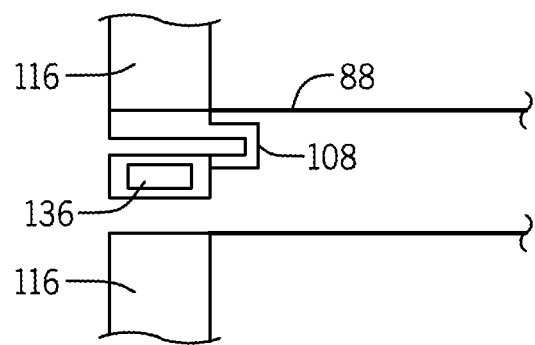
FIG. 15 is an enlarged view of a portion of FIG. 14 showing the PTC trace.

FIG. 15 shows the PTC trace 108 enlarged. Since the PTC trace can run alongside the lens heater trace 88, it can nearly have the same temperature as the lens heater trace. As the lens heater trace approaches 40 C, the PTC trace's resistance can begin to increase exponentially. At some point on the exponential curve 144 (see FIG. 13), the lens heater controller 48 can begin to regulate the lens heater voltage and thus decrease the power being dissipated by the lens heater circuit 52.

Figure 16:
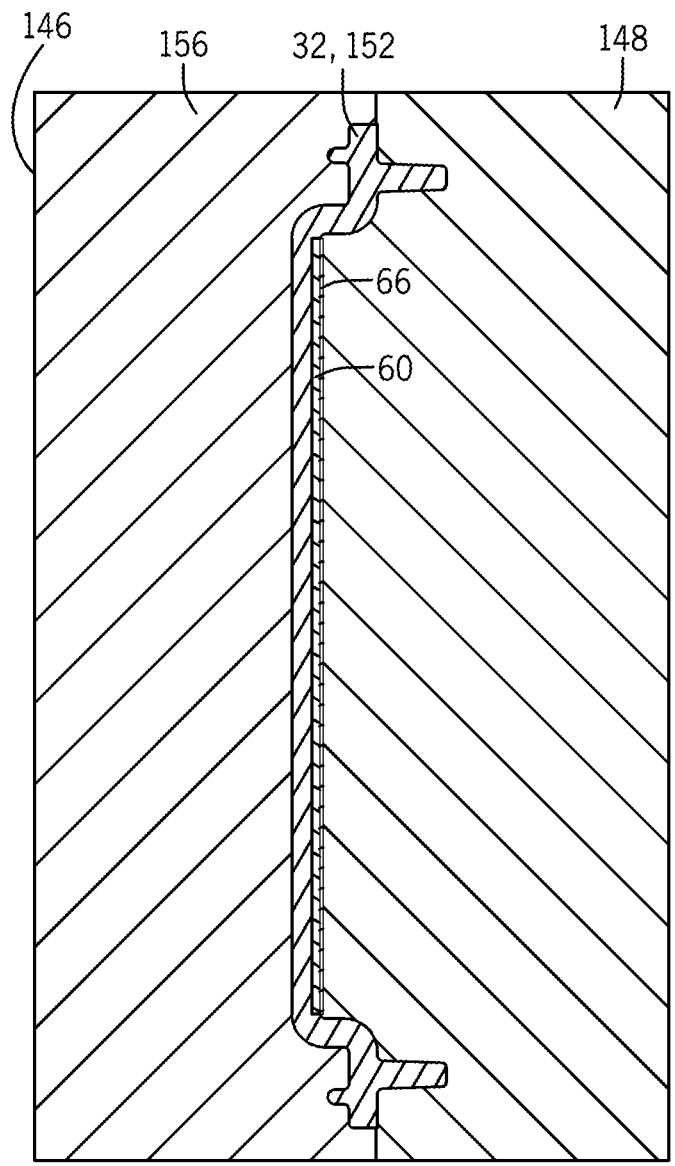
FIG. 16 is a schematic view showing a positioning of the ink and screen printed substrate in an injection molding tool to produce a lighting system lens with a lens heater in accordance with embodiments of the present invention.
Figure 17:
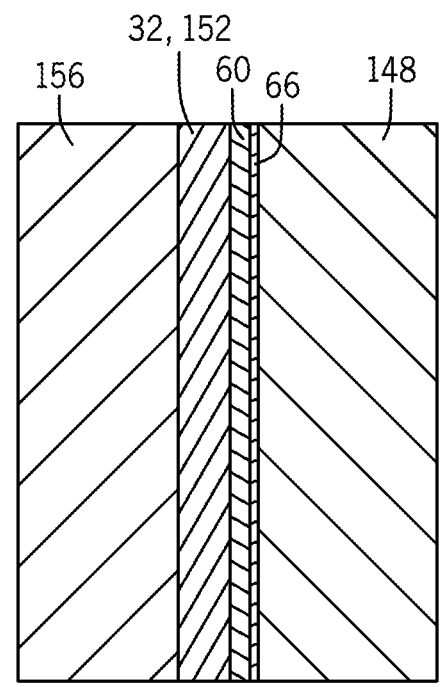
FIG. 17 is an enlarged view of a portion of FIG. 16.

FIG. 16 shows the positioning of the ink 66 and screen printed substrate 60 in an injection molding tool 146 to produce a lighting system lens with a lens heater. FIG. 17 is a close-up view. The clear substrate 60 with a screen printed conductive ink 66 pattern can be placed into a pocket on the core 148 with the ink side against the core. In this arrangement, the exposed ink side can remain exposed on the final lighting system lens part 32. Molten resin can then over mold the substrate 60, bonding only to the non-printed side of the clear substrate 60. In some embodiments, various types of thermoplastic polymers, such as polycarbonate materials, can be utilized as the injected resin 152 for the lens 32. It is to be appreciated that other assembly arrangements are contemplated where the ink 66 side remains exposed on the final lighting system lens part 32.

Figure 18:
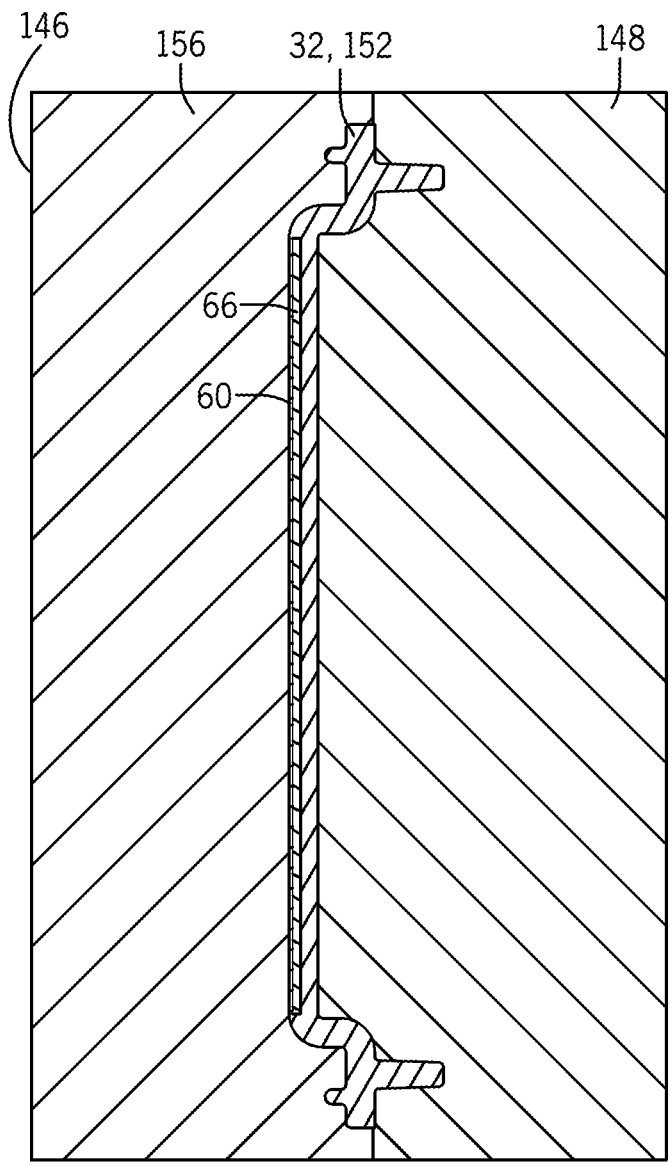
FIG. 18 is a schematic view showing an alternative positioning of the ink and screen printed substrate in an injection molding tool to produce a lighting system lens with a lens heater in accordance with embodiments of the present invention.
Figure 19:
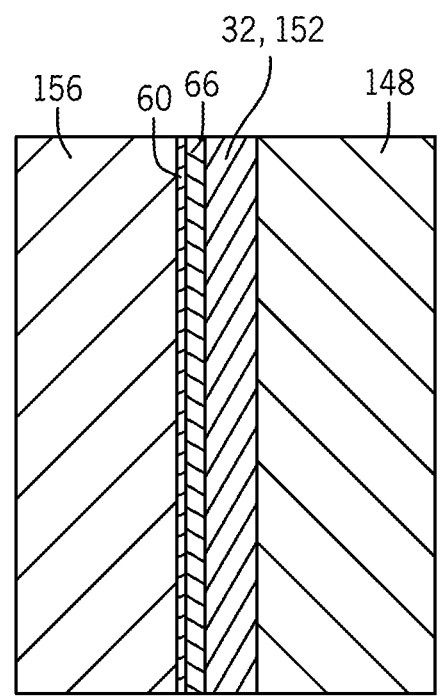
FIG. 19 is an enlarged view of a portion of FIG. 18.

FIG. 18 shows an alternative arrangement for the positioning of the ink 66 and screen printed substrate 60 in an injection molding tool 146 to produce a lighting system lens with a lens heater. FIG. 19 is a close-up view. The ink 66 can be encapsulated as well as with the clear substrate 60 placed against the cavity side 156 of the tool.

Testing showed successful over molding of the thermoplastic film substrate screen printed lens heater traces 88. Both were taped to the core of the injection molding tool to prevent material from pushing the label up against the cavity 156. The tool 146 can be modified to recess the thermoplastic substrate 60 and conductive ink 66 into the core 148 and to hold it there with a vacuum. In some embodiments, the conductive ink 66 can be exposed on the interior side 36 of the lens 32.

FIG. 20 includes a table that shows the optical impact of the lens heater traces 88 on low beam illumination and hi beam illumination. The impact of the lens heater traces 88 on illumination output is only minimal, and may be non-perceivable, and can be reduced further through thinner lens heater traces. In some embodiments, greater than 90 percent transmission rate in terms of both lumens and intensity can be achieved. This can be varied depending on the lighting system application by varying a thickness of the lens heater traces and the material used for the conductive traces 66 and the substrate 60.

Figure 21:
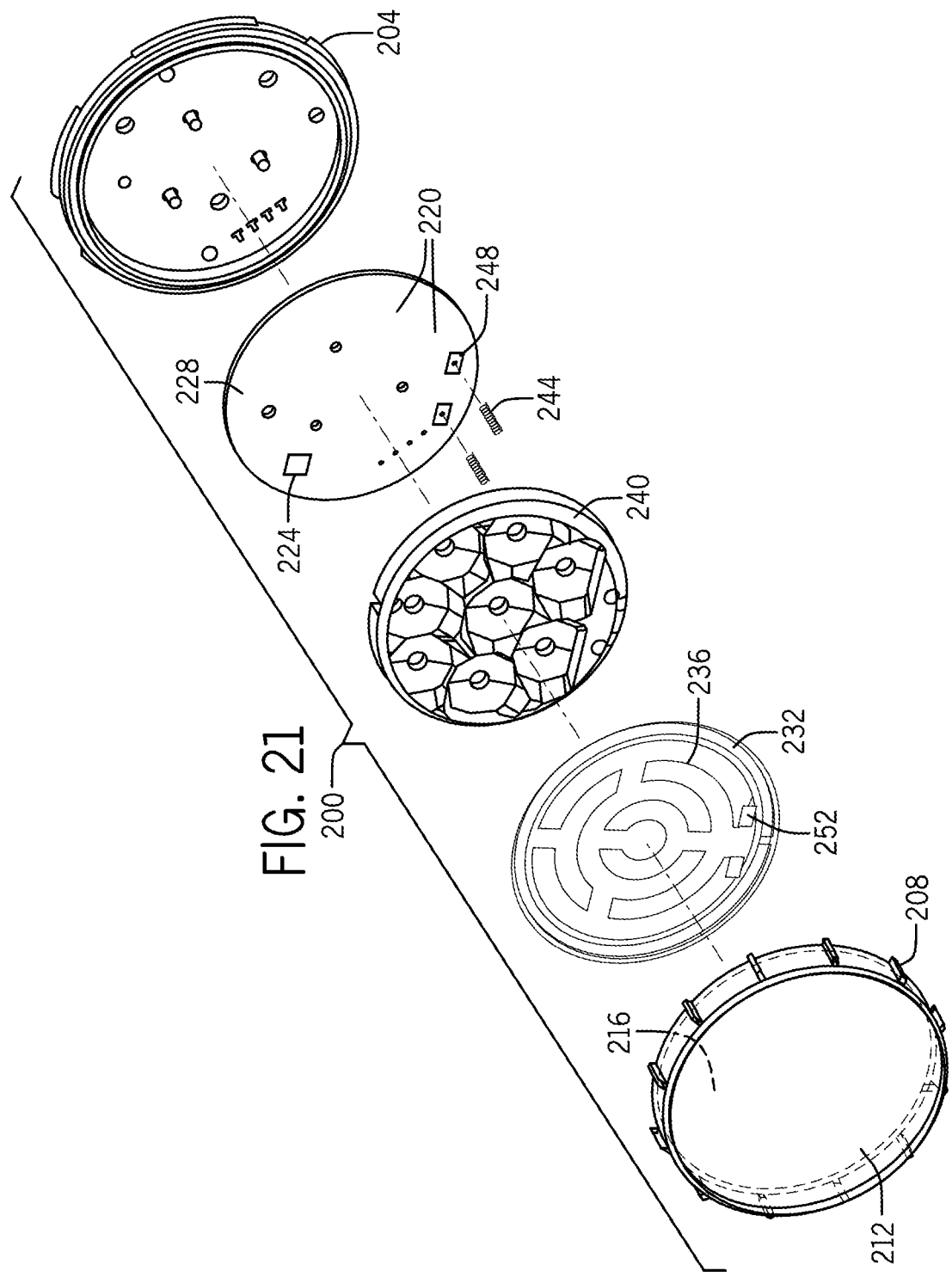
FIG. 21 is an exploded perspective view of an alternative embodiment of a lighting system with a lens heater in accordance with embodiments of the present invention.
Figure 22:
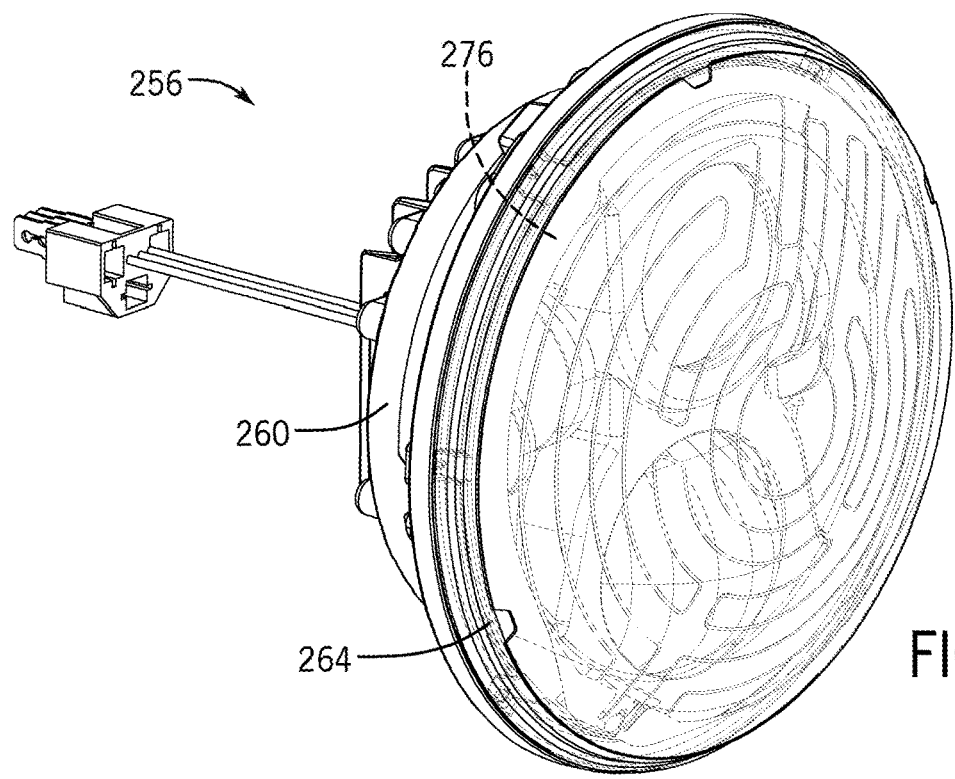
FIG. 22 is a perspective view of an alternative embodiment of a lighting system.
Figure 23:
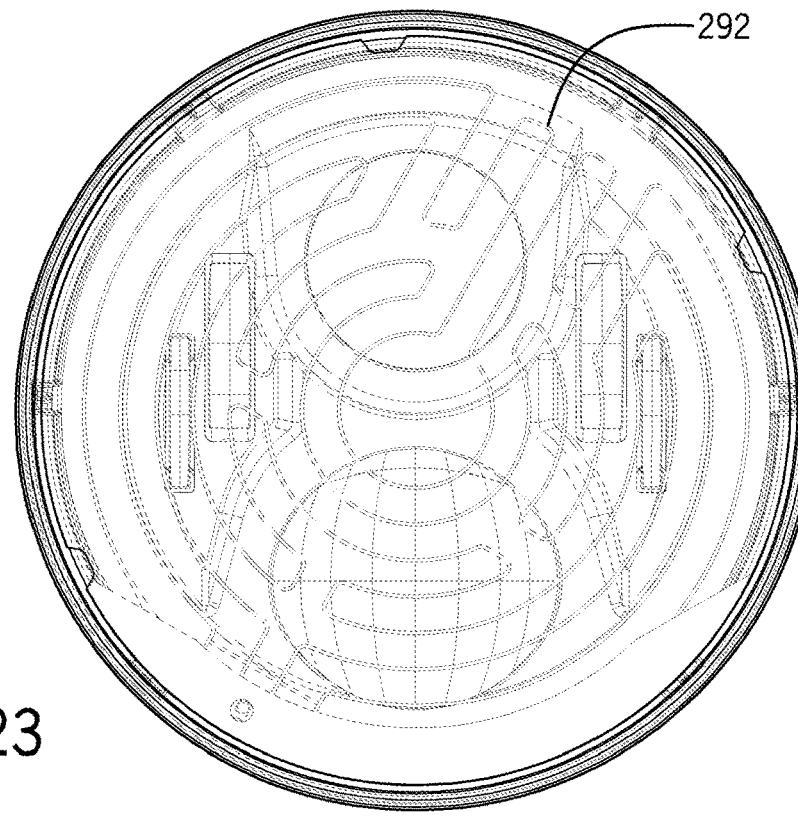
FIG. 23 is a front view of the lighting system of FIG. 22.

FIG. 21 shows an alternative embodiment of a lighting system 200. The lighting system 200 can include a base 204 and a lens 208. The lens 208 has an interior lens side 216 and an exterior lens side 212. At least one LED 220 can be positioned within the base 204 to provide illumination through the lens 208. A lens heater assembly 222 can include a lens heater controller 224, with a lens heater circuit 228 operatively coupled to the lens heater controller 224. In some embodiments, a substantially clear thermoplastic substrate 232 can be positioned on the interior lens side 216 of the lens, and a conductive ink or film circuit 236 can be positioned on the thermoplastic substrate 232 and can be operatively coupled to the lens heater circuit 228. In some embodiments, a reflector 240 can be included to guide illumination from the one or more LEDs 220. In some embodiments, the lens heater circuit 228 can include one or more contacts 248 to allow for the transmission of power from the lens heater circuit 228 to the conductive ink circuit 236. A conductive element 244, e.g., a spring or a wire, can be positioned to electrically couple the contact 248 with a contact 252 on the conductive ink circuit 236. In some embodiments, the conductive element 244 can pass through the reflector 240 to provide the power from the lens heater circuit 228 to the conductive ink circuit 236.

Figure 24:
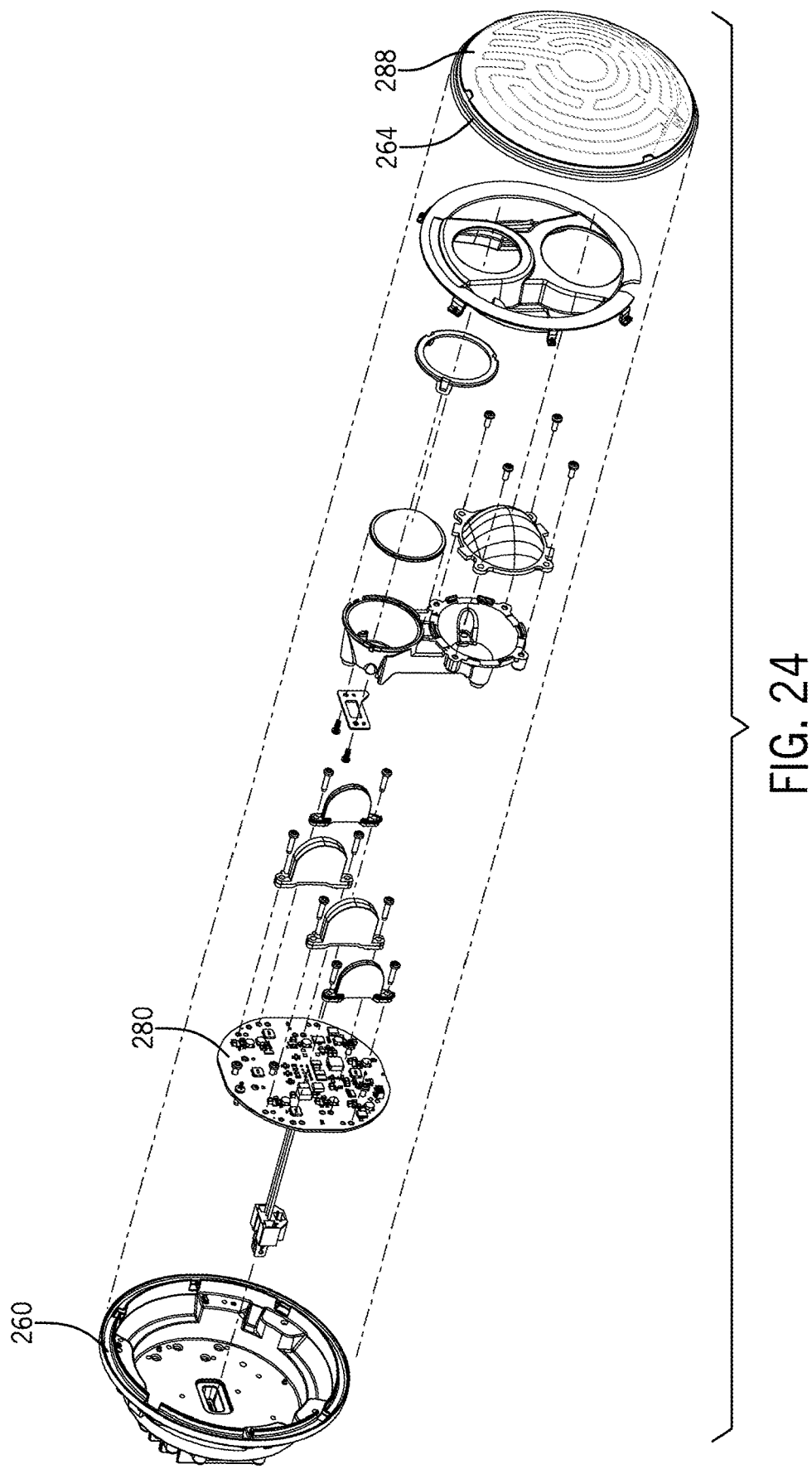
FIG. 24 is an exploded view of the lighting system of FIG. 22.
Figure 25:
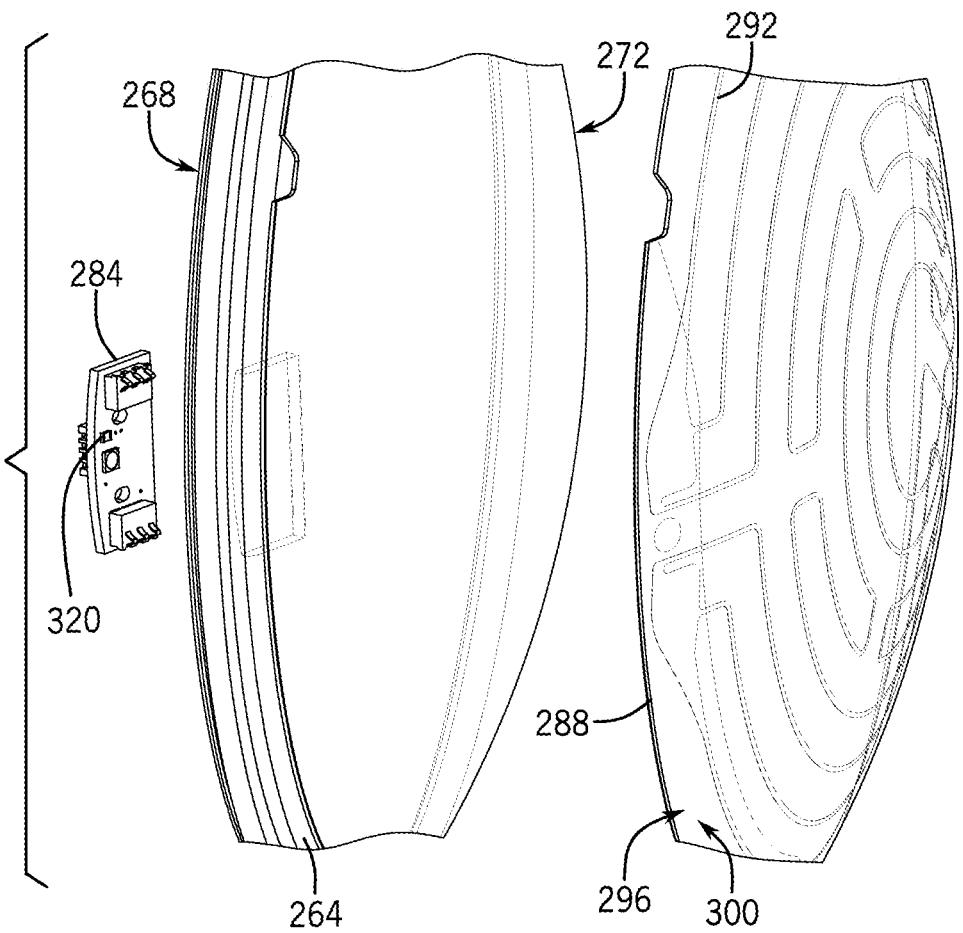
FIG. 25 is an exploded view of a lens, an interconnect assembly and a thermoplastic substrate of the lighting system of FIG. 22.
Figure 26:
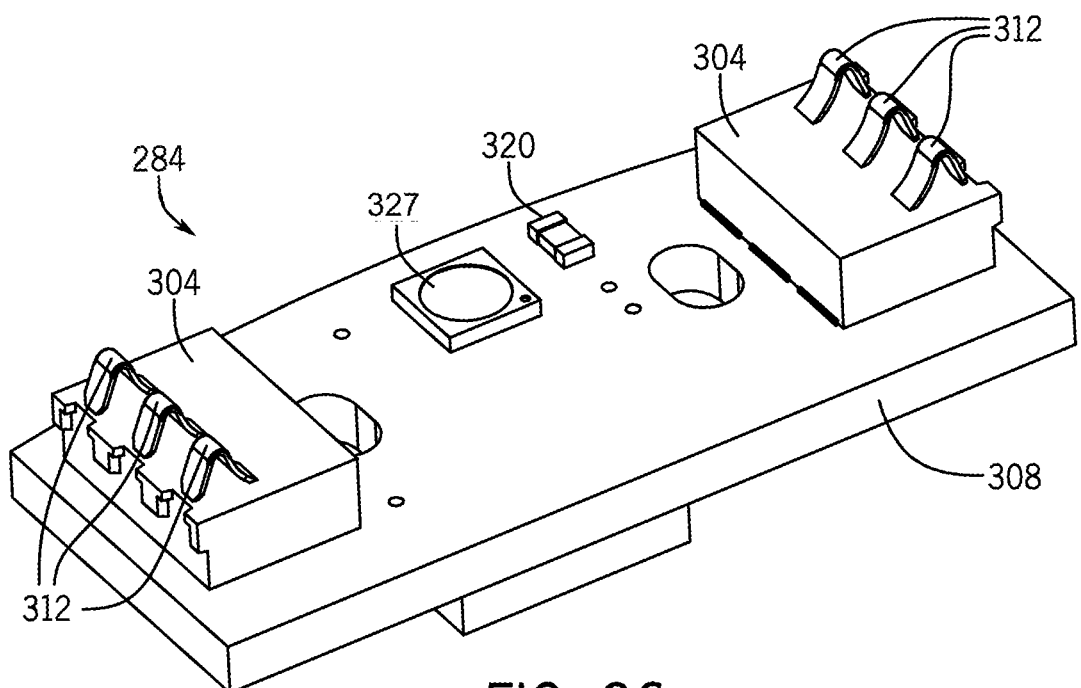
FIG. 26 is a perspective view the interconnect assembly of FIG. 22.
Figure 27:
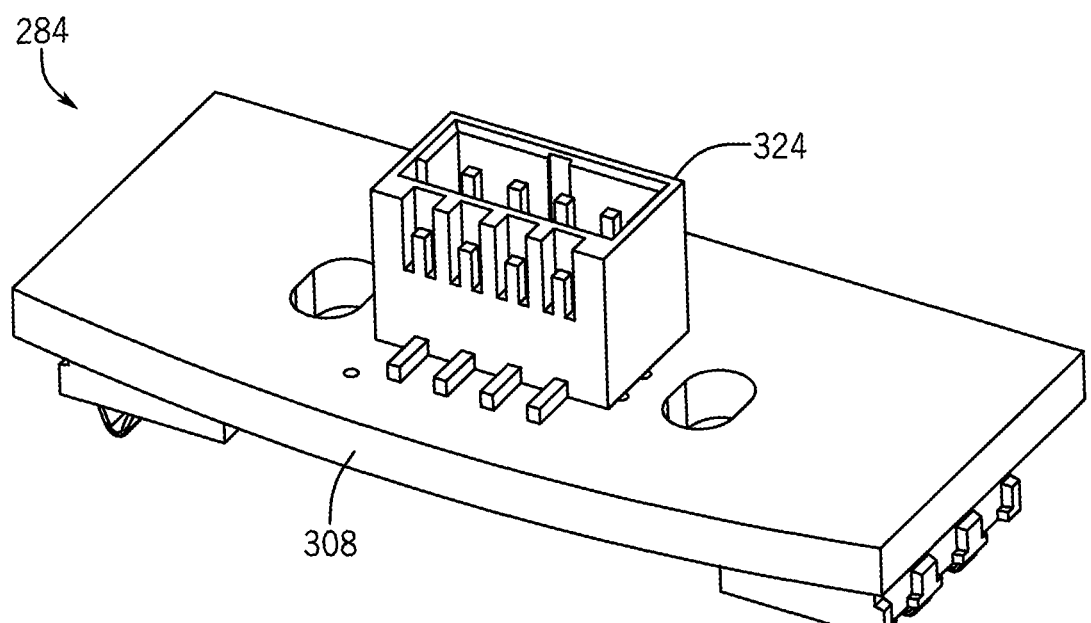
FIG. 27 is another perspective view the interconnect assembly of FIG. 22.
Figure 28:
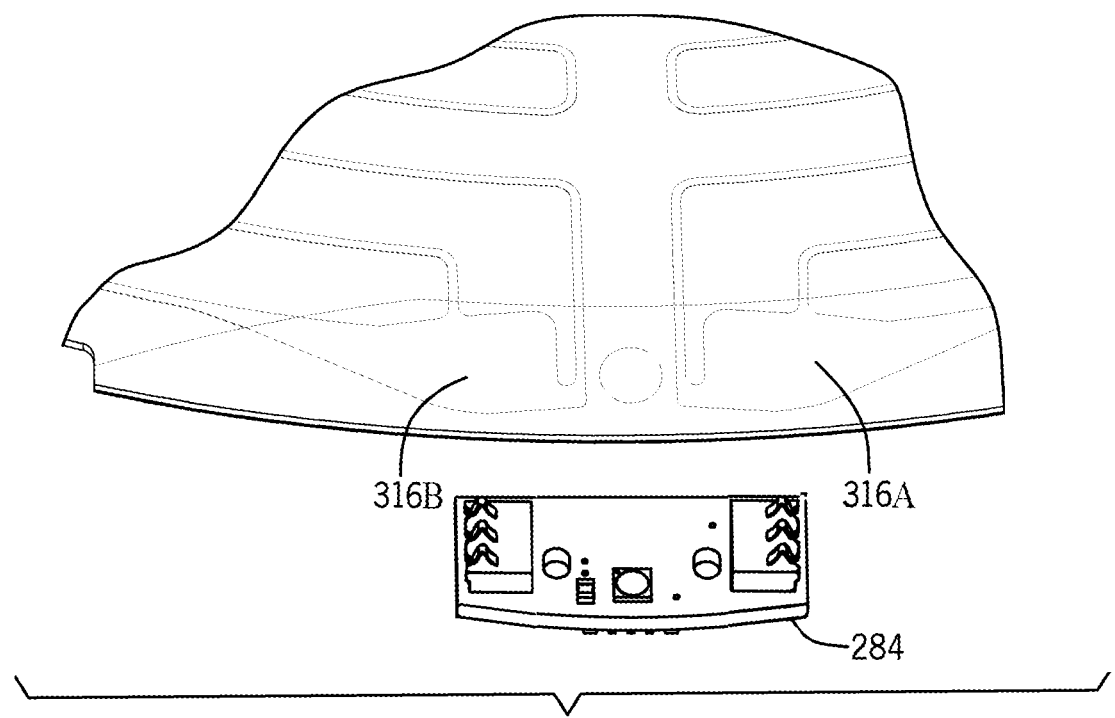
FIG. 28 is an exploded view of the interconnect assembly and the thermoplastic substrate of the lighting system of FIG. 22.
Figure 29:
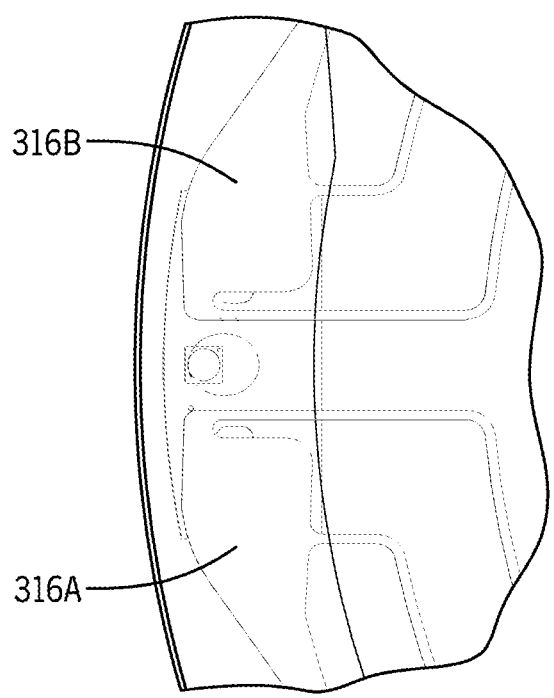
FIG. 29 is another view of the interconnect assembly and the thermoplastic substrate isolated from other components of the lighting system of FIG. 22.
Figure 30:
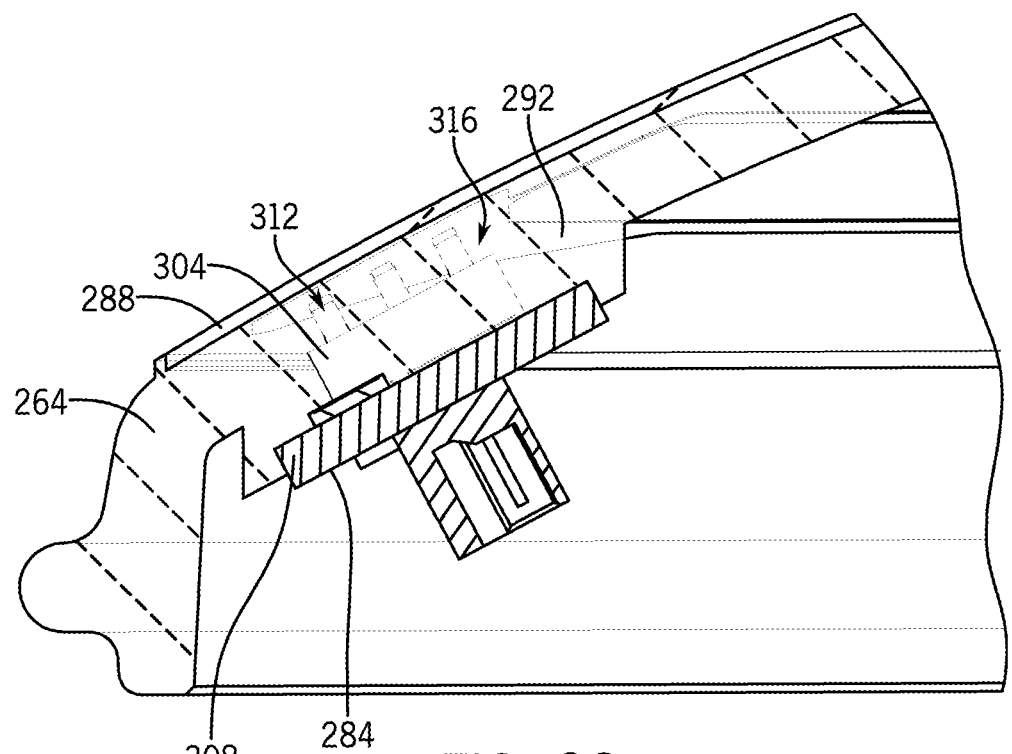
FIG. 30 is a cross sectional view of the lens, the interconnect assembly and the thermoplastic substrate of the lighting system of FIG. 22.

Referring to FIGS. 22-29, components of a lighting system 256 are shown according to embodiments of the present disclosure. The lighting system 256 can include a base 260 and a lens 264. As shown, the lens 264 has an interior lens side 268 and an exterior lens side 272. According to some embodiments, at least one LED 276 can be positioned within the base 260 to provide illumination through the lens 264. A lighting assembly 280 (e.g., as shown in FIG. 24) can include a controller and/or regulatory circuitry coupled to the at least one LED 276 to control power supplied to the at least one LED 276. Additionally, the lighting assembly 280 may be coupled to a interconnect assembly 284 (e.g., as shown in FIG. 25) in order to control power supplied to the interconnect assembly 284 and/or communication between the lighting assembly 280 and the interconnect assembly 284. The interconnect assembly 284 can be used to provide heat to a thermoplastic substrate 288, as will be explained below.

In some embodiments, the thermoplastic substrate 288 (e.g., as shown in FIG. 25) can be made from certain materials including substantially clear thermoplastic. A conductive ink circuit 292, which may also be referred to as a conductive film circuit, can be positioned on the thermoplastic substrate 288 and coupled to the interconnect assembly 284, details of which will be explained below. In some embodiments, the conductive ink circuit 292 can include conductive silver deposited on the thermoplastic substrate 288 using a known technique such as screen printing. The conductive ink circuit 292 can provide heat when appropriate electrical power is provided to the conductive ink circuit 292.

In some embodiments, the conductive ink circuit 292 can be positioned on an inner thermoplastic substrate surface 296 (e.g., as shown in FIG. 25). Additionally, the inner thermoplastic substrate surface 296 can be positioned over the lens 264. An outer thermoplastic substrate surface 300 can be exposed to an environment (including, for example, low temperatures) surrounding the lighting system 256. In some embodiments, the conductive ink circuit 292 may efficiently prevent ice from forming on the lighting system 256 when the thermoplastic substrate 288 is positioned on top of (e.g., over) the lens 264 due to the relative thickness of the thermoplastic substrate 288 as compared to the lens 264. The smaller thickness of the thermoplastic substrate can allow heat to be more efficiently transferred to the outermost surface of the lighting system 256, and may prevent ice from building up and potentially occluding illumination from the at least one LED 276.

In some embodiments, the interconnect assembly 284 can be coupled to the conductive ink circuit 292 in order to supply power to the conductive ink circuit 292. In shown by FIG. 26, the interconnect assembly 284 can include spring connectors 304 coupled to a circuit board 308, which can be a printed circuit board. Portions of the conductive ink circuit 292 may act as busbars to allow for efficient power transfer from the spring connectors 304 to the conductive ink circuit 292. In some embodiments, the spring connectors 304 can be included for power and ground terminals of the conductive ink circuit 292. Each spring connector 304 can have any number of pins 312, such as two pins, three pins, four pins, or five pins. Additional pins can allow for higher current carrying capacity due to a larger connection area on the conductive ink circuit 292. In some embodiments, the spring connectors 304 can be battery-type connectors, such as the 9155-200 battery connector offered by AVX®. The pins 312 can be flexed and/or depressed when the interconnect assembly 284 is pressed against the thermoplastic substrate 288. The pins 312 may be configured to be biased to an outermost position and require progressively increasing force to be further flexed and/or depressed as the interconnect assembly 284 is pressed against the thermoplastic substrate 288. The pins 312 and the interconnect assembly 284 can then be held in place as injection molded around the interconnect assembly 284 to form the lens 264, as will be explained below.

Busbars 316 can be placed in contact with the spring connectors 304 and coupled to interconnect assembly 284, details of which will be explained below. The busbars 316 may have a larger cross sectional area, and thus reduced resistivity, along the length of busbars 316 as compared to the other portions of the conductive ink circuit 292 that may utilize higher resistivity in order to generate heat. The busbars 316 may include a first busbar 316A and a second busbar 316B. Depending on the electrical configuration of the interconnect assembly 284, the first busbar 316A can act as a power busbar with the second busbar 316B acting as a ground or neutral busbar. Alternatively, the first busbar 316A can act as a ground or neutral busbar with the second busbar 316B acting as a power busbar.

A thermistor 320, which can be a negative temperature coefficient (NTC) resistor, can be coupled to the circuit board 308 and placed in contact with the lens 264 during manufacturing of the lens 264, which will be explained in detail below. The thermistor 320 can be used to sense a temperature of the lens 264. The power supplied to the conductive ink circuit 292 can then be controlled based on the temperature sensed by the thermistor 320, according to some embodiments.

In some embodiments, a pin connector 324 can be positioned on the circuit board and coupled to the thermistor 320 and/or the spring connectors 304. The pin connector 324 can have any number of interfaces, such as pins for providing appropriate electrical connections for the circuit board. For example, four pins can be included to provide a power connection, a ground connection, a connection for a first terminal of the thermistor 320, and a connection for a second terminal of the thermistor 320, respectively. The power connection and the ground connection can be used to supply power directly to the conductive ink circuit 292 or to a regulatory circuit of the circuit board 308 for controlling power supplied to the conductive ink circuit 292, which will be explained below. The connections to the thermistor 320 can be used to provide a measure of the resistance across the thermistor 320 to another circuit board and/or controller. In some embodiments, additional pins can be provided for other electrical devices that may be coupled to the circuit board 308 such as optical sensors, additional conductive ink circuits, or additional thermistors.

In some embodiments, an indicator light 327 can be coupled to the circuit board 308 and configured to turn on when power is supplied to the conductive ink circuit 292. As an example, the indicator light 327 can be an LED coupled to the conductive ink circuit 292. In some embodiments, the indicator light 327 may be coupled to dedicated indicator light pins included in the pin connector 324 and controlled by an external circuit and/or controller coupled to the indicator light pins, and configured to selectively supply power to the indicator light pins.

According to one non-limiting example embodiment, the lighting system 256 was subjected to testing regarding functionality at a range of temperatures as well as deicing capabilities. The testing procedure included placing a thermocouple centered on the outer surface of an outer lens, in this case, the thermoplastic substrate 288. The lighting system 256 was then orientated as it would be oriented within a vehicle (e.g., lens 264 placed near an LED light), and with the thermoplastic substrate 288 and lens 264 visible through an observation window. Thermocouple measurements and current measurements of currents supplied to the lighting system were recorded over the duration of the test. A sampling rate of the measurements was high enough to observe the temperature at which the heater turns on. The lighting system 256 was placed in a thermal chamber at 30° C. and powered on high beam and low beam at 13.5 VDC. Temperature in the chamber was ramped from 30° C. to −30° C. over a duration of one hour. The temperature in the chamber then remained at −30° C. for a duration of one hour. The lighting system 256 was then subjected to a temperature of −30° C. for one hour while a 2 mm thick layer of ice accumulated on the thermoplastic substrate 288 and/or lens 264 by occasionally applying water to the thermoplastic substrate 288 and/or lens 264. The lighting system 256 was then supplied with 13.5 VDC with high beam and low beam on. Monitoring of the ice was stopped when the ice on the lighting system 256 exhibited a steady state (defined as no change over 10 minutes), or when the lighting system 256 had been powered on for one hour. The lighting system 256 was then assessed to determine if functionality was maintained after the testing, if all ice had been cleared from the thermoplastic substrate 288 and/or lens 264, and if the lighting system 256 had sustained any damage from testing. Here, functionality was maintained, ice was cleared, and the lighting system 256 did not sustain any damage. Accordingly, the lighting system 256 was deemed to pass the testing criteria.

Referring to FIGS. 22-30, a cutaway view of the positioning of the thermoplastic substrate 288 and the interconnect assembly 284 within the lens 264 is shown. An injection molding process can be used to overmold the thermoplastic substrate 288 and the interconnect assembly 284 with a thermoplastic polymer, such as polycarbonate materials to create the lens 264. An injection molding tool with a cavity and a core can be used to position the thermoplastic substrate 288 and the interconnect assembly 284. The thermoplastic substrate 288 can be positioned against the cavity with the conductive ink circuit 292 facing away from the cavity.

In some embodiments, at least a portion of the interconnect assembly 284 can be placed with the spring connectors 304 facing the thermoplastic substrate 288 in a pocket of the core. Portions of the interconnect assembly 284 that may be placed in the pocket of the core include heating connectors 304 and a circuit board 308. The pocket can be sized to hold the interconnect assembly 284 in place before the resin has cooled and hardened around the interconnect assembly 284. Once the resin has cooled, the lens 264 can bond to at least a portion of the interconnect assembly 284 and at least a portion of the thermoplastic substrate 288 and hold the interconnect assembly 284 and the thermoplastic substrate 288 in place, forming the lens 264, thermoplastic substrate 288, and the interconnect assembly 284 as a single piece of construction (i.e. the lens 264 may resist removal of the thermoplastic substrate 288 and/or the interconnect assembly 284). In some embodiments, the interconnect assembly 284, spring connectors 304, and/or pins 312 may be positioned at least partially within the lens 264.

Forming the lens 264, thermoplastic substrate 288, and the interconnect assembly 284 as a single piece of construction can ease repair of the lighting system 256 such as replacing LEDs. As an example, a user may only need to remove the lens 264 and unplug the pin connector 324 from any attached cables without removing the interconnect assembly 284 and/or the thermoplastic substrate 288 from a position in which a suitable electrical connection is made between the pins 312 of the interconnect assembly 284 and the conductive ink circuit 292 positioned on the thermoplastic substrate 288, thus removing a potentially complex step of rearranging the interconnect assembly 284 against the conductive ink circuit 292 and/or the thermoplastic substrate 288 in order to recreate the suitable electrical connection, as will be explained below.

According to some embodiments, the core and the interconnect assembly 284 can then be moved towards the cavity and the thermoplastic substrate 288 until the pins 312 are slightly depressed. In some embodiments, the pins 312 can be depressed by a predetermined amount, such that a sufficient electrical connection can be formed. As one example, the pins 312 can be depressed by about 10%-30% of a total range of motion of the pins 312, and are in contact with the busbars 316 and/or the conductive ink circuit 292. As described above, thermoplastic polymers, such as polycarbonate materials, can be utilized as injected resin plastic material to form the lens 264. After the pins 312 have been depressed, the resin plastic material can then be injected into the tool. The plastic material and/or the lens 264 can overmold at least a portion of the conductive ink circuit 292. The plastic material and/or the lens 264 can insulate portions of the conductive ink circuit 292 that are not in contact with the spring connectors 304. Once the plastic material has hardened, the lens 264 can hold the spring connectors 304 and the interconnect assembly 284 in place, i.e. with the pins 312 depressed, to ensure the interconnect assembly 284 remains suitably electrically coupled to the conductive ink circuit 292.

The placement of the interconnect assembly 284 and more specifically the spring connectors 304 against the thermoplastic substrate 288 can be selected in order to ensure that the spring connectors 304 maintain a suitable electrical connection with the conductive ink circuit 292. If the interconnect assembly 284 is positioned too far inward towards the thermoplastic substrate 288, the pins 312 may apply excessive pressure to the conductive ink circuit 292 and potentially break through the conductive ink circuit 292. If the interconnect assembly 284 is positioned too far away from the thermoplastic substrate 288, the pins 312 may not depress far enough and be moved out of contact with the conductive ink circuit 292.

In some scenarios, if the pins 312 are not depressed far enough, injected resin may move the pins 312 out of contact with the conductive ink circuit 292. As described above, the pins may be configured to require progressively increasing force to be further flexed and/or depressed as the interconnect assembly 284 is pressed against the thermoplastic substrate 288. The pins 312 may require a relatively low amount of force to be displaced further when displaced a relatively short distance. After the interconnect assembly 284 has been positioned against the thermoplastic substrate 288, resin can be injected into the injection molding tool. The injected resin may press against the pins 312 in a sufficient manner to further depress the pins 312 away from the thermoplastic substrate (and thus out of contact with the conductive ink circuit 292). This can occur if the pins are not depressed far enough, and are biased outwards with an insufficient force to resist further depression from the injected resin.

In some embodiments, the suitable electrical connection between the pins 312 and the conductive ink circuit 292 can be a low resistance connection. The resistance of the electrical connections is preferably close to zero ohms. In some embodiments, a suitable amount of resistance can be less than about ten percent or less of the resistance of the conductive ink circuit 292.

To determine an appropriate location to position the interconnect assembly 284 against the thermoplastic substrate 288, a thermal camera can be used to determine if there is a suitable electrical connection between the interconnect assembly 284 and the conductive ink circuit 292. The thermal camera can be used to detect heat around areas where the pins 312 contact the conductive ink circuit 292. Power can be applied to the interconnect assembly 284 and the conductive ink circuit 292, and if excessive heat is being dispersed around areas where the pins 312 contact the conductive ink circuit 292, the electrical connection between the interconnect assembly 284 and the conductive ink circuit 292 may not be efficient. The location of the interconnect assembly 284 against the thermoplastic substrate 288 can be tuned until a threshold of maximum heat being dispersed has been met without causing the pins 312 to break through the conductive ink.

The thermistor 320 can be over molded by the resin and be placed in contact with the lens 264. The thermistor 320 may then be used to sense a temperature of the lens 264, which may be indicative of a temperature of the exterior lens side 272 of the lens 264. The temperature indicated by the resistance of the thermistor 320 may be lower than the surrounding temperature due to the thickness of the lens 264. For example, a resistance value indicative of 20° C. may correspond to a temperature of 5-15° C. at the exterior lens side 272. The difference in temperature can be accounted for via the circuitry powering the conductive ink circuit 292, such that the conductive ink circuit 292 provides heat when the temperature of the exterior lens side 272 is low enough to potentially freeze the exterior lens side 272.

Figure 31:
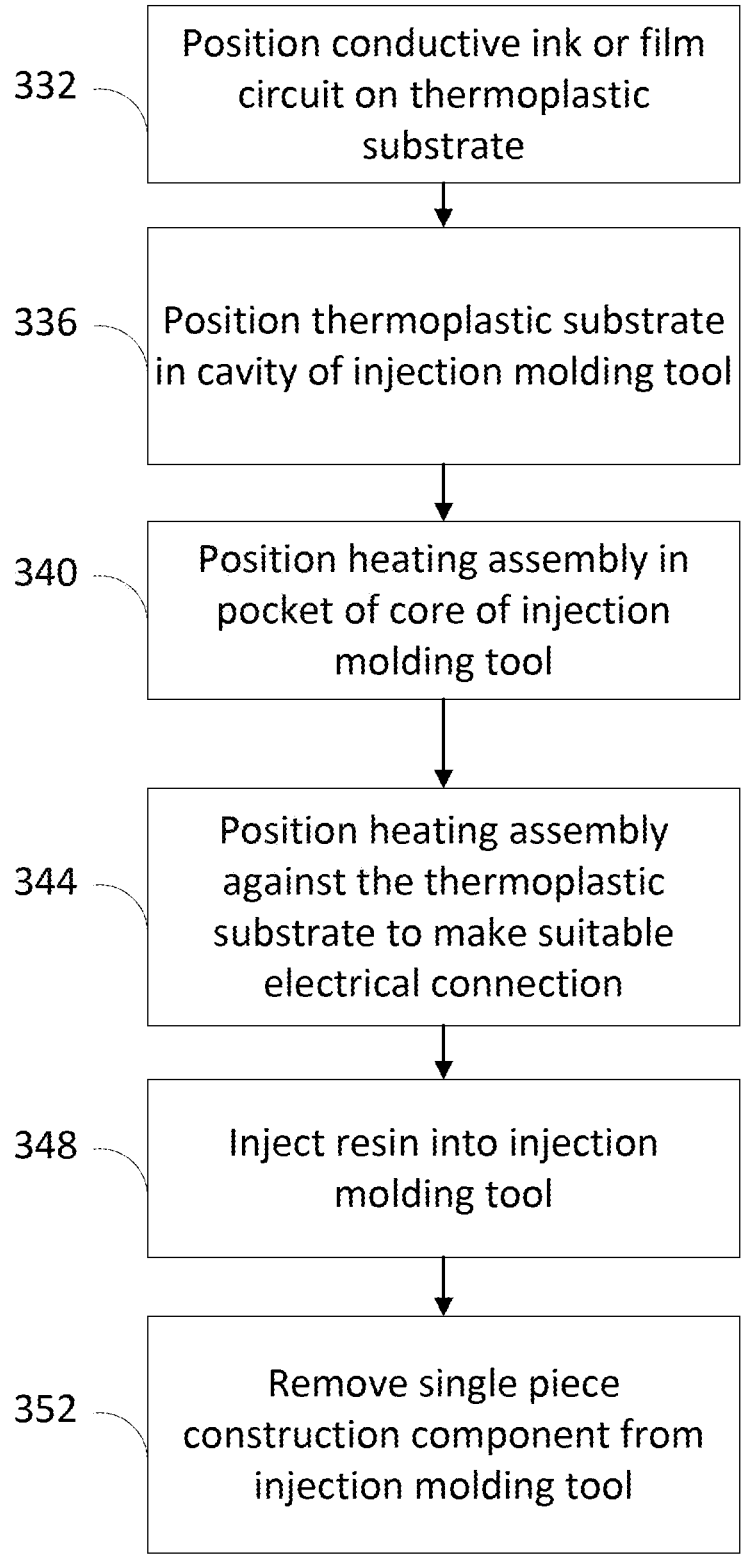
FIG. 31 shows an example process for manufacturing a lens bonded to at least a portion of a thermoplastic substrate and an interconnect assembly, according to some embodiments.

FIG. 31 shows an example process 328 for manufacturing a lens bonded to at least a portion of a thermoplastic substrate and a interconnect assembly. At process step 332, a conductive ink or film circuit can be positioned on the thermoplastic substrate using a known technique such as screen printing. In some embodiments, the conductive ink or film circuit can include silver traces. Once the conductive ink or film circuit has settled, the process 328 can proceed to step 336.

At process step 336, the thermoplastic substrate can be positioned in a cavity of an injection molding tool. Specifically, a side of the thermoplastic substrate without the conductive ink or film circuit can be placed against a wall of the cavity, with the conductive ink or film circuit facing away from the cavity. The process can then proceed to step 340.

At process step 340, a interconnect assembly can be positioned in a pocket of a core of the injection molding tool. The interconnect assembly can have one or more spring connectors, each with a plurality of pins, and a thermistor arranged on side of a circuit board. The interconnect assembly can be positioned with the spring connectors facing the cavity and more specifically the conductive ink or film circuit. The process can then proceed to step 344.

At process step 344, the interconnect assembly can be positioned against the thermoplastic substrate to establish a suitable electrical connection between the interconnect assembly and the thermoplastic substrate. Specifically, the connection can be established at the conductive ink or film circuit while closing the injection molding tool. As described above, the placement of the interconnect assembly and more specifically the spring connectors against the thermoplastic substrate 288 can be selected in order to ensure that the spring connectors maintain a suitable electrical connection with the conductive ink circuit. If the interconnect assembly is positioned too far inward towards the thermoplastic substrate, the pins may apply excessive pressure to the conductive ink circuit and potentially break through the conductive ink circuit. If the interconnect assembly is positioned too far away from the thermoplastic substrate, the pins may not depress far enough and be moved out of contact with the conductive ink circuit during injection of the resin.

As described above, the pins may be configured to require progressively increasing force to be further flexed and/or depressed as the interconnect assembly is pressed against the thermoplastic substrate. The pins may require a relatively low amount of force to be displaced further when displaced a relatively short distance. After the interconnect assembly has been positioned against the thermoplastic substrate, resin can be injected into the injection molding tool. The injected resin may press against the pins in a sufficient manner to further depress the pins away from the thermoplastic substrate (and thus out of contact with the conductive ink circuit). This can occur if the pins are not depressed far enough, and are biased outwards with an insufficient force to resist further depression from the injected resin.

In some embodiments, the suitable electrical connection between the pins and the conductive ink circuit can have a small percentage of the resistance of the conductive ink circuit alone. For example, if the conductive ink circuit has a resistance of two hundred ohms, the suitable electrical connection may have a resistance of ten ohms, or about five percent of the total resistance of the conductive ink circuit. In some embodiments, the suitable electrical connection can have a resistance of about one percent or less of the resistance of the conductive ink circuit, about two percent or less of the resistance of the conductive ink circuit, about five percent or less of the resistance of the conductive ink circuit, about eight percent or less of the resistance of the conductive ink circuit, or about ten percent or less of the resistance of the conductive ink circuit 292. Once a suitable electrical connection has been obtained, the process can proceed to step 348.

At process step 348, resin can be injected into the injection molding tool. The resin can be a thermoplastic polymer. A portion of the interconnect assembly, a portion of the thermistor and/or a portion of the spring connectors can be over molded by the resin. A portion of the interconnect assembly, a portion of the thermistor and/or a portion of the spring connectors can be partially contained within the lens and/or bonded to the lens. A portion of the thermistor can then be placed in contact with the lens that will be formed by the resin. The thermistor may then be used to sense a temperature of the lens, which may be indicative of a temperature of the exterior lens side of the lens. Once the resin hardens and forms the lens, the interconnect assembly, thermoplastic substrate, and the lens can form a single piece construction component. The process can then proceed to step 352. At process step 352, the single piece component can be removed from the injection molding tool and placed or utilized in a heated lighting system.

Figure 32:
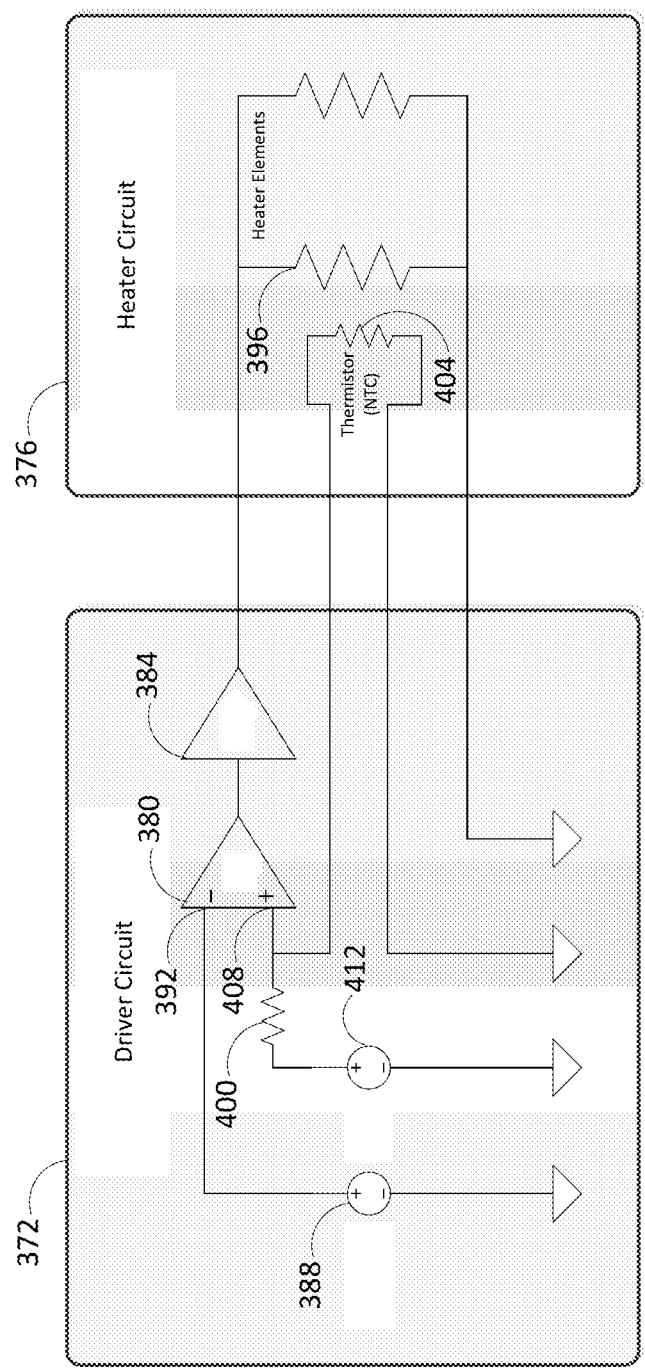
FIG. 32 shows a circuit diagram of a driver circuit and a heater circuit, according to some embodiments.

Referring to FIG. 32, a circuit diagram of a driver circuit 372 and a heater circuit 376 is shown, according to some embodiments. The driver circuit 372 can include a temperature difference amplifier 380 and a driver amplifier 384. The temperature difference amplifier 380 can be coupled to a temperature set point voltage supply 388 at a first input 392. The temperature set point voltage supply 388 can provide a predetermined voltage that corresponds to a temperature threshold below which the driver circuit 372 will provide power to heater elements 396. The heater elements 396 can include a conductive ink circuit arranged as described above. In some embodiments, the heater elements 396 can be a conductive ink circuit. Power connections for the amplifiers are not shown for simplicity.

The temperature difference amplifier 380 can be coupled to a resistor 400 and a thermistor 404 at a second input 408. The resistor 400 can be coupled to a fixed voltage supply 412. The fixed voltage supply 412 can provide a predetermined voltage that is higher than the voltage supplied by the temperature set point voltage supply 388.

The thermistor 404 can be a NTC resistor as described above. The thermistor 404 can generally follow a predetermined resistance v. temperature curve, which can be provided by a manufacturer of the thermistor 404. The thermistor 404 may provide more resistance with decreasing temperatures. The thermistor 404 can be configured to sense a temperature of a lens of a heated lighting system as described above, such as being arranged to be in contact with an overmolded lens. As described above, the temperature indicated by the thermistor 404 may be different than the exterior lens temperature. This difference in temperature can be accounted for by selecting appropriate voltages to be supplied by the temperature set point voltage supply 388 and the fixed voltage supply 412.

The voltage at the second input 408 can vary as the thermistor 404 becomes more or less resistive based on temperature. As temperatures decrease and the thermistor 404 provides increasingly more resistance than the resistor 400, less voltage from the fixed voltage supply 412 is dropped across the resistor 400 and the voltage at the second input 408 is relatively higher than the voltage at the second input 408 when the thermistor 404 provides less resistance. If the voltage at the second input 408 is higher than the voltage at the first input 392 (i.e. the voltage provided by the temperature set point voltage supply 388), the temperature difference amplifier 380 can provide a nonzero voltage to the driver amplifier 384. The driver amplifier 384 can then amplify the provided voltage and supply power to the heater elements 396. If the voltage at the second input 408 is lower than the voltage at the first input 392, the temperature difference amplifier 380 may provide a voltage of about zero to the driver amplifier 384. The driver amplifier 384 may then provide no power to the heater elements 396.

Portions of the driver circuit 372 and the heater circuit 376 may be positioned at various locations within a lighting system. In some embodiments, both the driver circuit 372 and the heater circuit 376 may be included in a interconnect assembly such as interconnect assembly 284 as described above in conjunction with FIGS. 22-30 above. For example, the driver circuit 372 and the heater circuit 376 can be included in a circuit board such as circuit board 308 as described above in conjunction with FIGS. 22-30. In some embodiments, the heater circuit 376 may be included in a interconnect assembly and the driver circuit may be positioned elsewhere in the lighting system. In some embodiments, the driver circuit 372 may be included in a lighting assembly configured to power LEDs of the lighting system.

In some embodiments, the fixed voltage supply 412 can be coupled to a switch such as an electrical switch or electromechanical switch in order to allow a user or a device such as an electrical device or a mechanical device to control power supplied to the heater elements 396. If the fixed voltage supply 412 is not supplying a voltage to the second input 408, the driver circuit 372 may not supply power to the heater elements 396. The user or device can then effectively turn the heater on by closing the switch or off by opening the switch. When the switch is closed, power can be supplied to the heater elements 396 to be supplied based on the resistance of the thermistor 404 and thus a temperature of the lens of the lighting system. When the switch is open, power can be prevented from being supplied to the heater elements 396.

Figure 33:
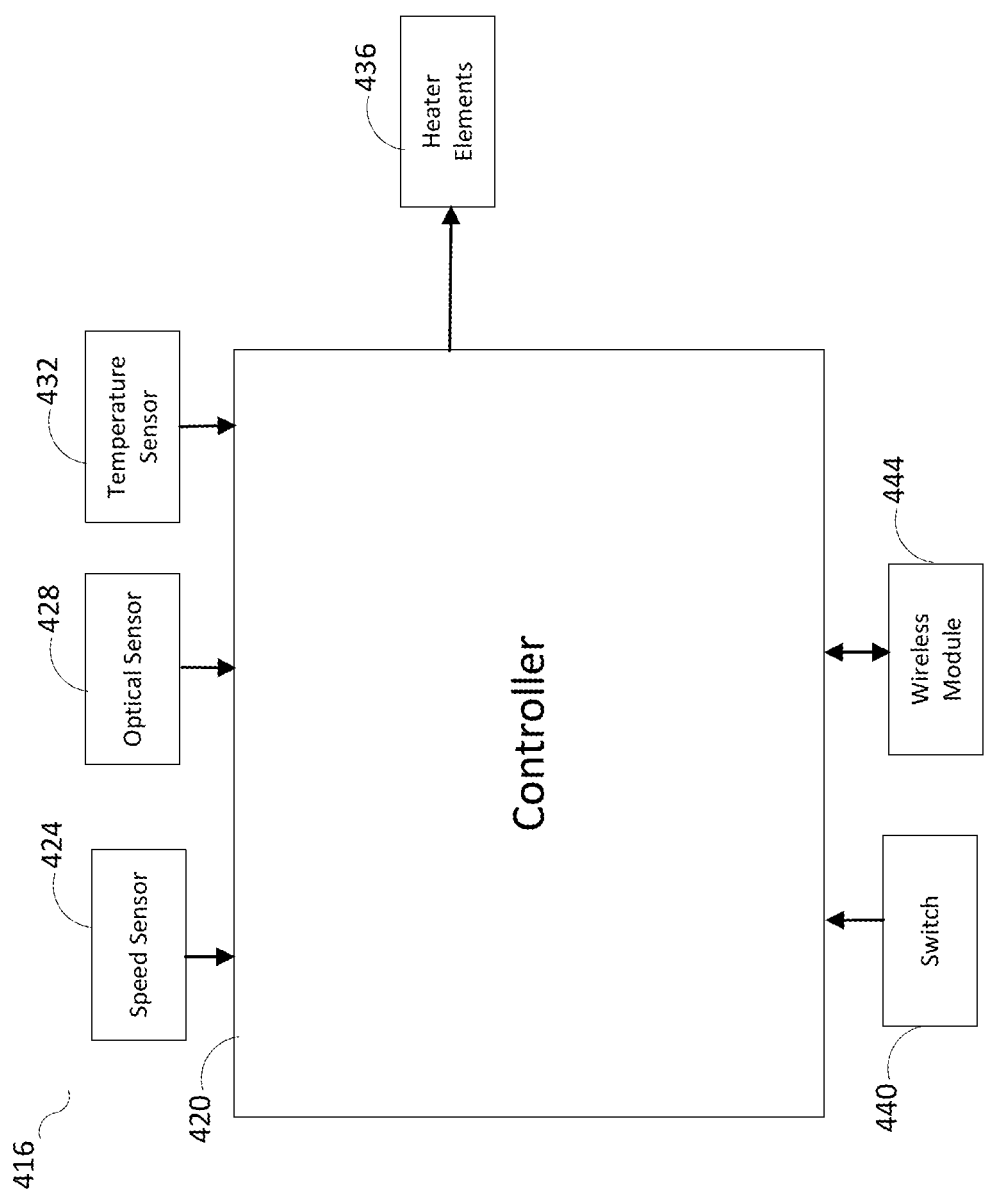
FIG. 33 shows an exemplary box diagram for an exemplary heater control system of a lighting system, according to some embodiments.

Referring to FIG. 33, a box diagram for a heater control system 416 of a lighting system is shown, according to some embodiments. The heater control system 416 can include a controller 420 coupled to and in communication with a speed sensor 424, an optical sensor 428, and a temperature sensor 432. The controller 420 can also be coupled to heater elements 436 and configured to selectively supply power to the heater elements. The controller 420 can be positioned within a housing of a lighting system. The heater elements 436 can include a conductive ink circuit positioned on a thermoplastic substrate of a lighting system as described above. The controller 420 can supply power to the heater elements 436 based on signals received from the speed sensor 424, the optical sensor 428, and/or the temperature sensor 432, as will be described below.

The controller 420 can receive a temperature value from the temperature sensor 432. The temperature value can be a signal indicative of a temperature sensed by the temperature sensor 432. The temperature sensor 432 can be a thermistor included in a interconnect assembly as described above. The controller 420 can supply power to the heater elements 436 based on the temperature value. In some embodiments, the controller 420 can receive the temperature value, determine the temperature value is below a predetermined threshold, and supply a predetermined amount of power corresponding to the temperature value to the heater elements 436 in response to determining the temperature value is below the predetermined threshold. The controller 420 may supply more power to the heater elements 436 at lower temperature values. The controller 420 may have a plurality of predetermined amounts of power corresponding to a plurality of predetermined thresholds of temperature values in order to better supply an appropriate amount of power for a given temperature. In some embodiments, the controller 420 can input the temperature value to a model configured to output a power amount, receive the power amount from the model, and supply power to the heater elements 436 based on the power amount. The model can include an algorithm for determining power supplied as a function of temperature values, and can be determined based on field testing data of the effectiveness of the lighting system at various temperatures and amounts of power supplied to the heater elements 436.

The controller 420 can receive an optical value from the optical sensor 428. The optical value can be a signal indicative of light sensed by the optical sensor 428. The optical sensor 428 can be positioned in the lighting system in order to determine about how much light is shining through a lens and/or thermoplastic substrate of the lighting system. Low optical values may indicate that the lighting system has at least partially frozen over or is otherwise occluded by sleet, ice, snow, etc. If the optical value is below a predetermined threshold, the controller 420 can supply power to the heater elements 436. In some embodiments, the controller 420 can receive the optical value, determine the optical value is below a predetermined threshold, and supply a predetermined amount of power corresponding to the optical value to the heater elements 436 in response to determining the optical value is below the predetermined threshold. The controller 420 may supply more power to the heater elements 436 at lower optical values. The controller 420 may have a plurality of predetermined amounts of power corresponding to a plurality of predetermined thresholds of optical values in order to better supply an appropriate amount of power for a given optical value. In some embodiments, the controller 420 can input the optical value to a model configured to output a power amount, receive the power amount from the model, and supply power to the heater elements 436 based on the power amount. The model can include an algorithm for determining power supplied as a function of optical values, and can be determined based on field testing data of the effectiveness of the lighting system at various levels of occlusion corresponding to sensed optical values and amounts of power supplied to the heater elements 436.

The controller 420 can receive a speed value from the speed sensor 424. In some embodiments, the speed sensor 424 can be a speedometer coupled to the vehicle that the lighting system is coupled to. The speed value can be a signal indicative of a speed sensed by the speed sensor 424. At speed values associated with relatively high speed, for example highway speeds, it may be necessary to provide more power to the heater elements 436 due to sleet, snow, and/or ice accumulating on the lighting system more rapidly than at relatively low speeds. If the speed value is above a predetermined threshold, the controller 420 can supply power to the heater elements 436. In some embodiments, the controller 420 can receive the speed value, determine the speed value is above a predetermined threshold, and supply a predetermined amount of power corresponding to the speed value to the heater elements 436 in response to determining the speed value is above the predetermined threshold. The controller 420 may supply more power to the heater elements 436 at higher speed values. The controller 420 may have a plurality of predetermined amounts of power corresponding to a plurality of predetermined thresholds of speed values in order to better supply an appropriate amount of power for a given speed value. In some embodiments, the controller 420 can input the speed value to a model configured to output a power amount, receive the power amount from the model, and supply power to the heater elements 436 based on the power amount. The model can include an algorithm for determining power supplied as a function of speed values, and can be determined based on field testing data of the effectiveness of the lighting system at various speeds corresponding to sensed speed values and amounts of power supplied to the heater elements 436. In this way, an appropriate amount of power to be supplied at a given speed can be determined.

In some embodiments, the controller 420 can supply power to the heater elements 436 based on a combination of a received speed value, optical value, and/or temperature value. For example, the controller 420 can have a stored lookup table of power values, each power value corresponding to a predetermined speed value, optical value, and/or temperature value. Using a combination of a received speed value, optical value, and/or temperature value to determine the power output can allow the controller 420 to provide a more appropriate level of power to the heater elements 436 than if a single value was used.

The controller 420 can be coupled to a switch 440. The controller 420 can receive a wired input value from the switch 440, which can allow a user or a device such as an electrical device or a mechanical device to input commands to the controller 420. The wired input value can be used to determine how much power is supplied to the heater elements 436. The wired input value can have a range of values based on the construction of the switch 440. For example, the switch 440 can supply an "on" value and an "off" value if the switch is a two position selector switch or a relay. Alternatively, the switch 440 can supply an "off" value, a first position value, and a position level value if the switch is a three position selector switch. Further, a continuous range of values may be supplied if the switch is a potentiometer. Other ranges of values corresponding to a range of power values can be supplied to the heater elements 436. The controller 420 can supply a predetermined amount of power corresponding to the position of the switch 440, i.e. an amount for an "on" value, a first position value, and/or a second position value. If the switch 440 can supply a continuous range of values, the controller 420 can receive a wired input value, determine that the wired input value is indicative of a switch position value such as an "on" value, a first position value, or second position value, and supply a predetermined amount of power corresponding to the switch position value to the heater elements 436.

In some embodiments, the controller 420 can be coupled to and in communication with a wireless module 444. The controller 420 can receive a wireless input value from the wireless module 444, which can be a transceiver capable of one or two-way communication using one or more wireless protocols including but not limited to Bluetooth, WiFi, Zigbee, or other appropriate wireless communication protocols. The wireless input value can be sent from an electrical device that may be external to the lighting system, such as a smartphone or a control FOB. The smartphone can be configured to run an application capable of receiving user input from an interface and sending an appropriate wireless input value based on the user input. In some embodiments, the wireless module 444 can be included in the controller 420. The controller 420 can receive a wireless input value, determine the wireless input value is indicative of a power level to be supplied to the heater elements 436 such as an "on" value corresponding to a fixed predetermined power level or one of a range of power values such as a first power value and or second power value, and supply a predetermined amount of power corresponding to the power level to the heater elements 436.

Figure 34:
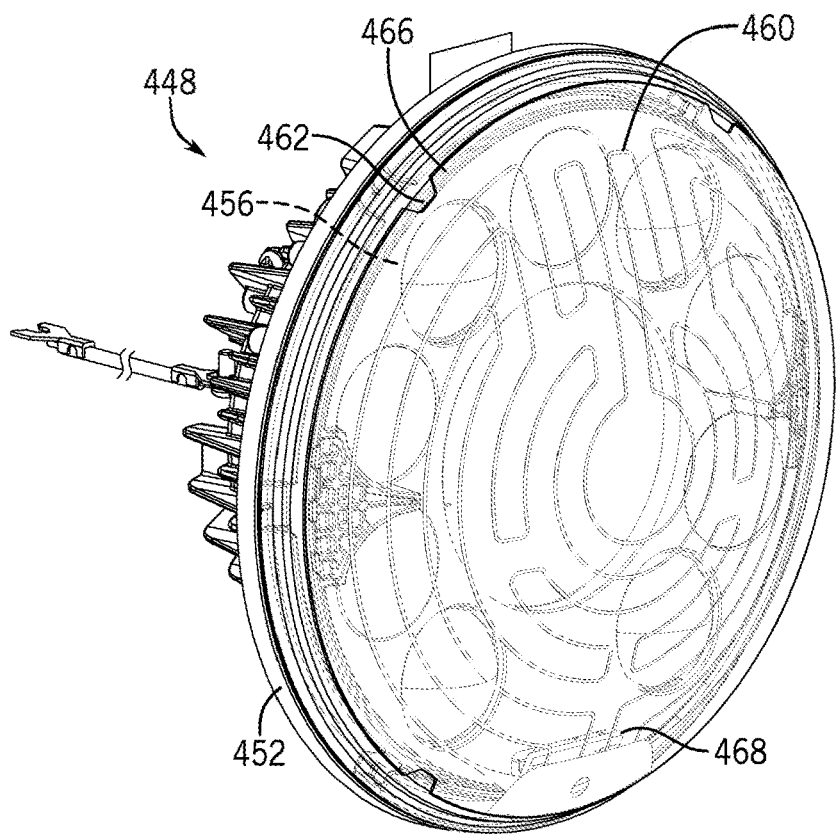
FIG. 34 is a perspective view of an alternative embodiment of a lighting system.
Figure 35:
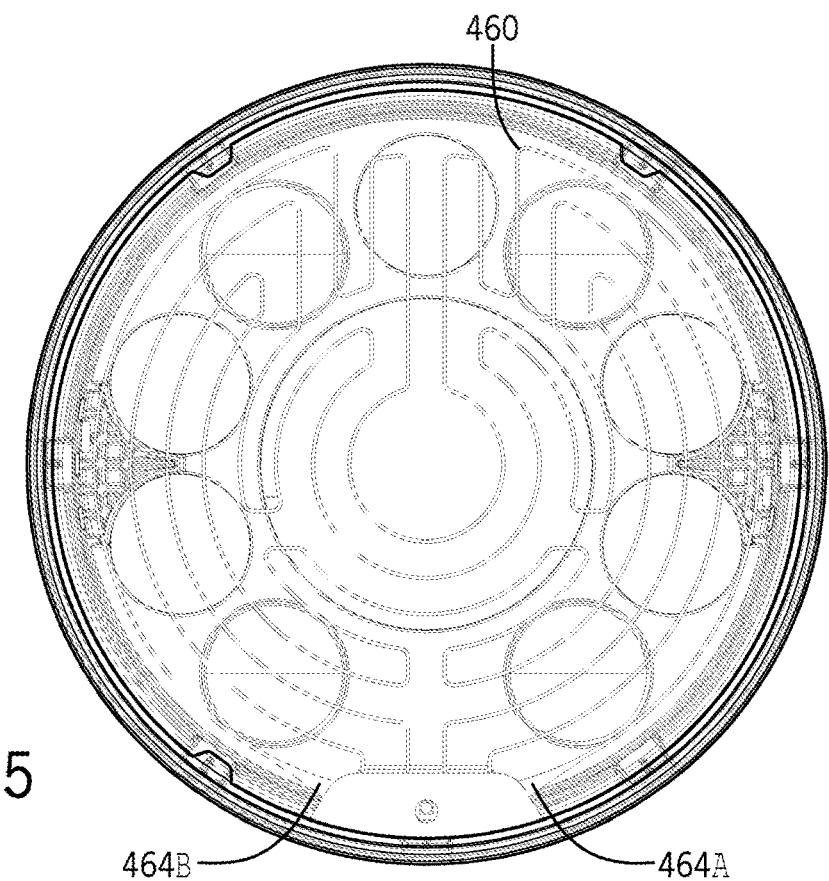
FIG. 35 is a front view of the lighting system of FIG. 34.
Figure 36:
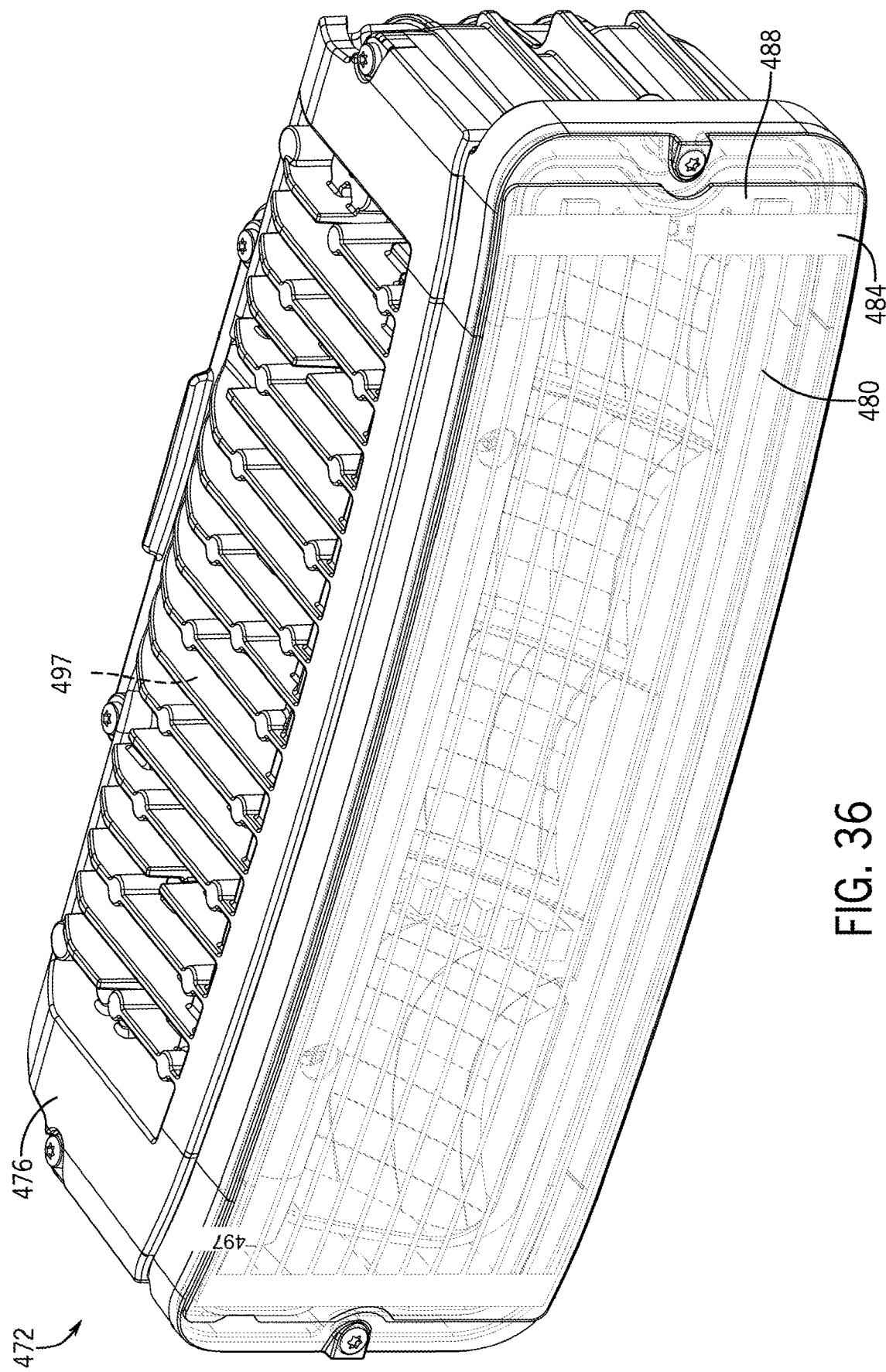
FIG. 36 is a perspective view of an alternative embodiment of a lighting system.
Figure 37:
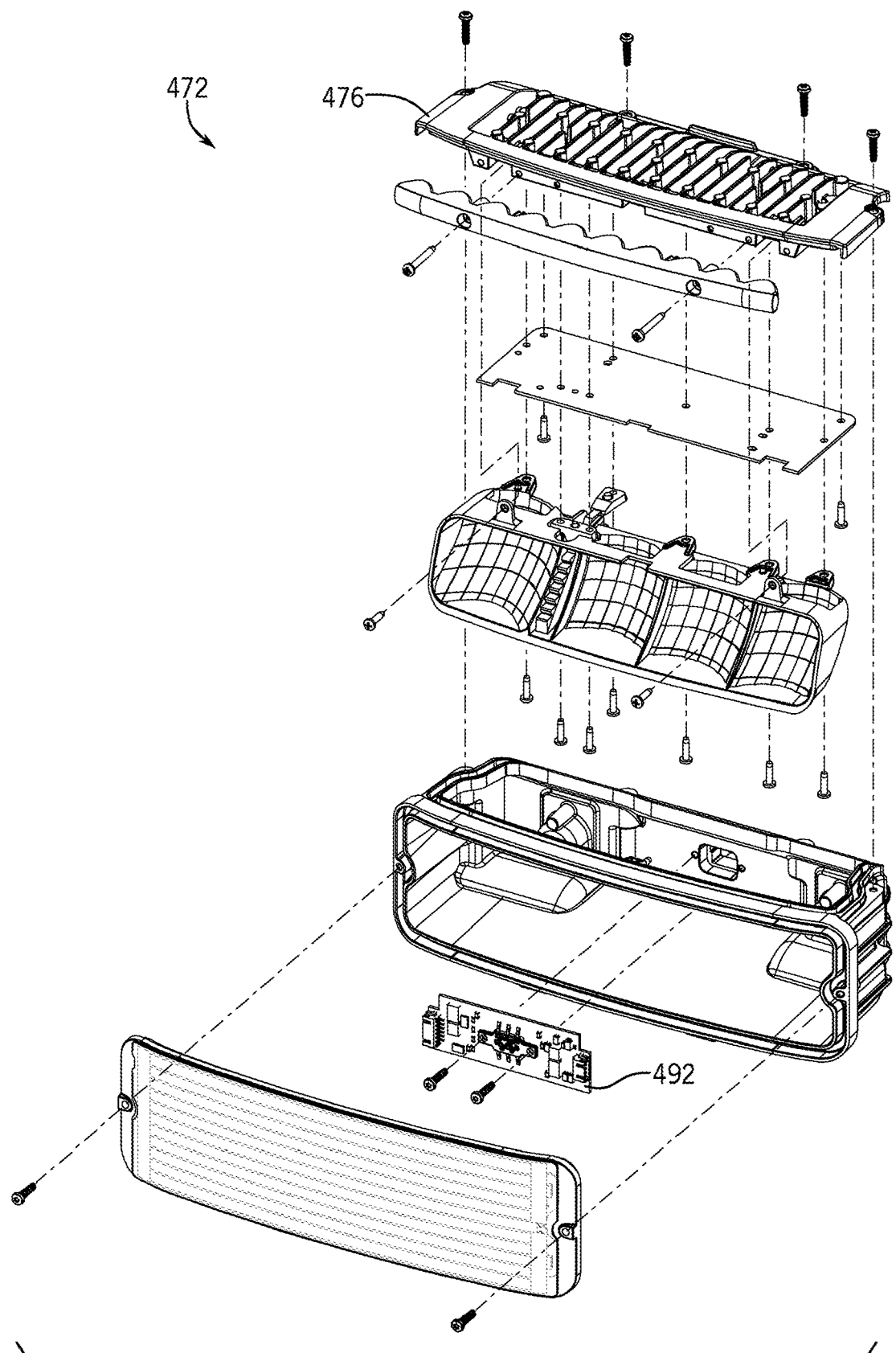
FIG. 37 is an exploded view of the lighting system of FIG. 36.
Figure 38:
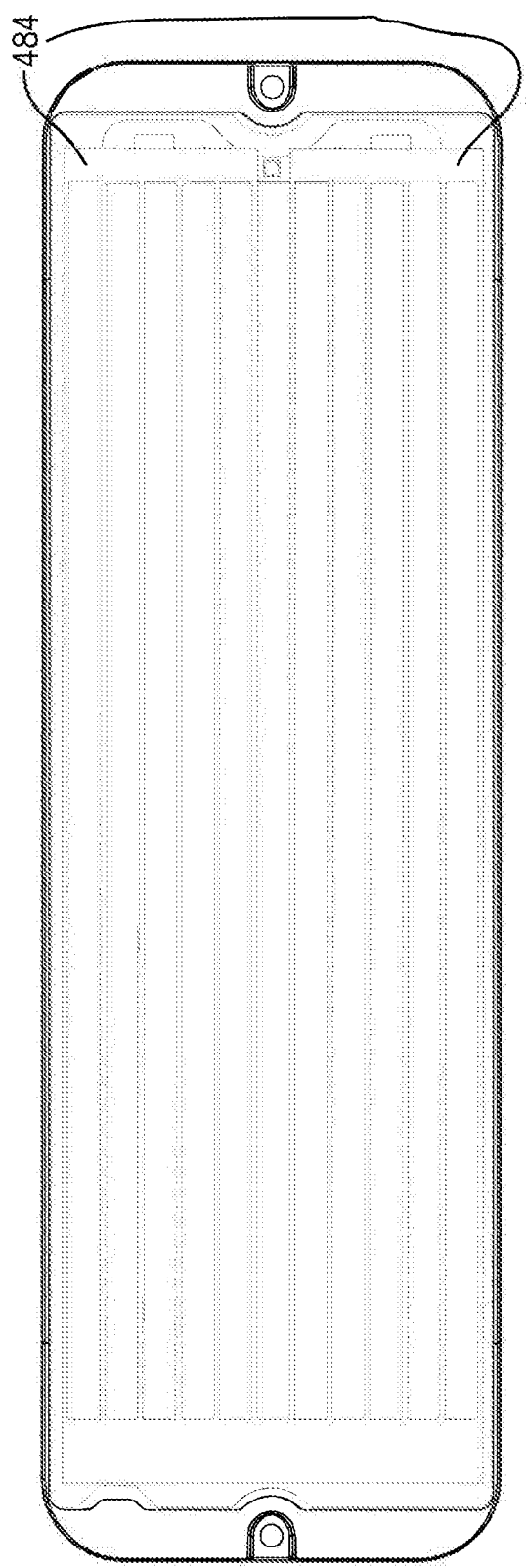
FIG. 38 is a front view of the lighting system of FIG. 36.
Figure 39:
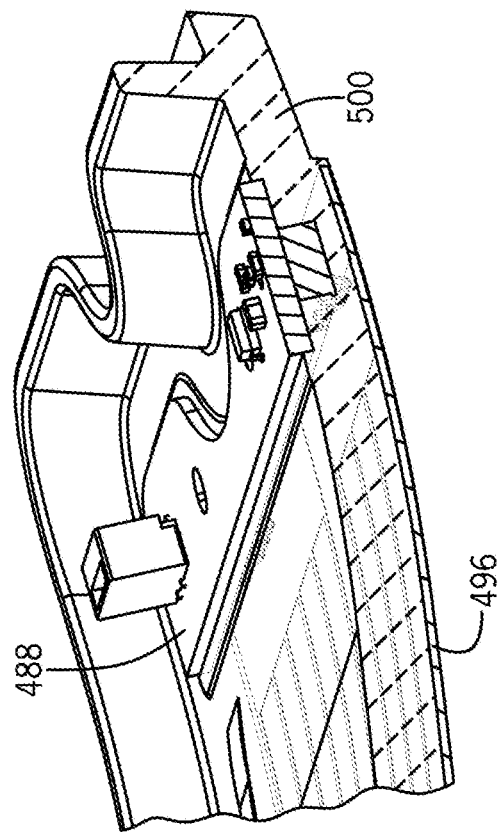
FIG. 39 is a view of an interconnect assembly, a lens, and a thermoplastic substrate of the lighting system of FIG. 36.
Figure 40:
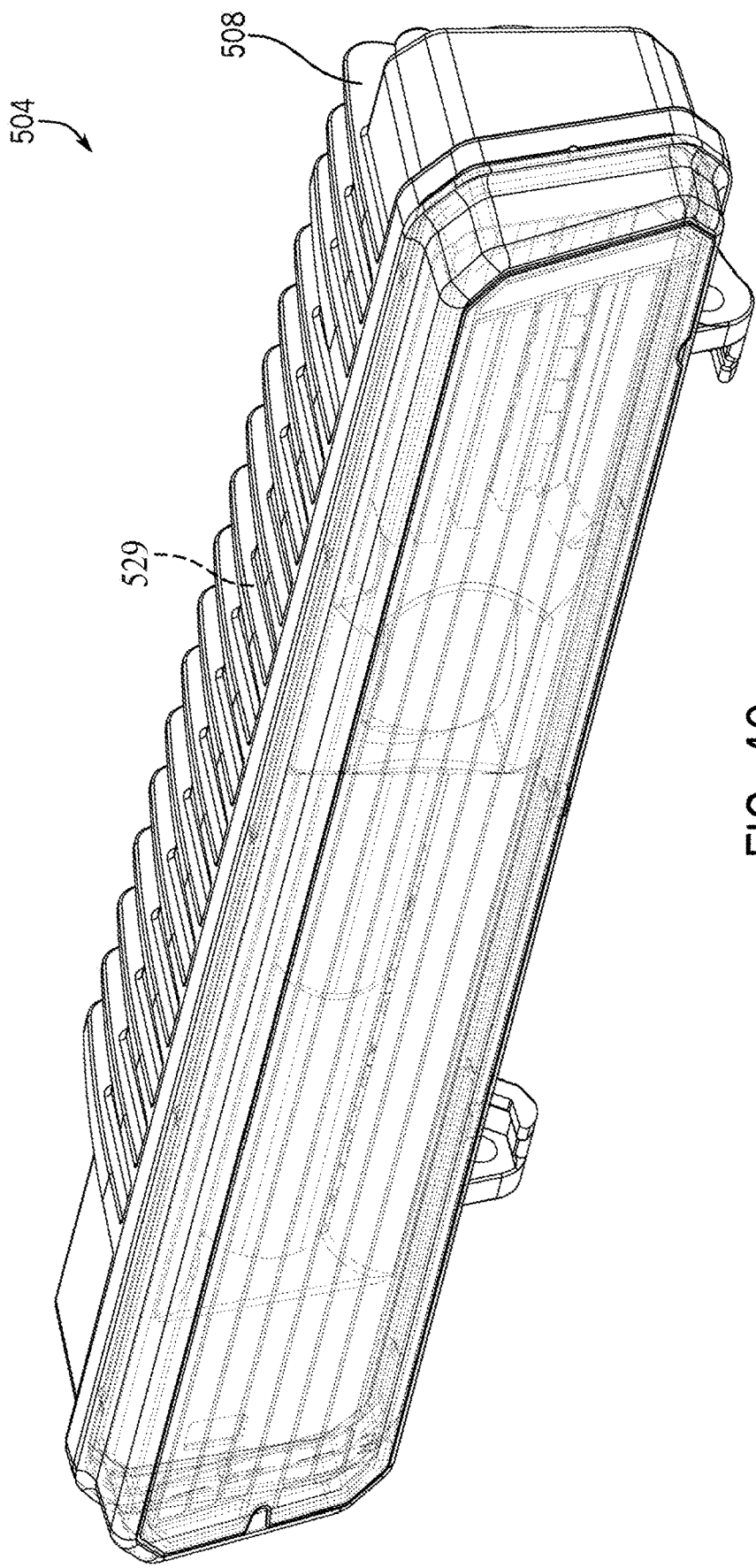
FIG. 40 is a perspective view of an alternative embodiment of a lighting system.
Figure 41:
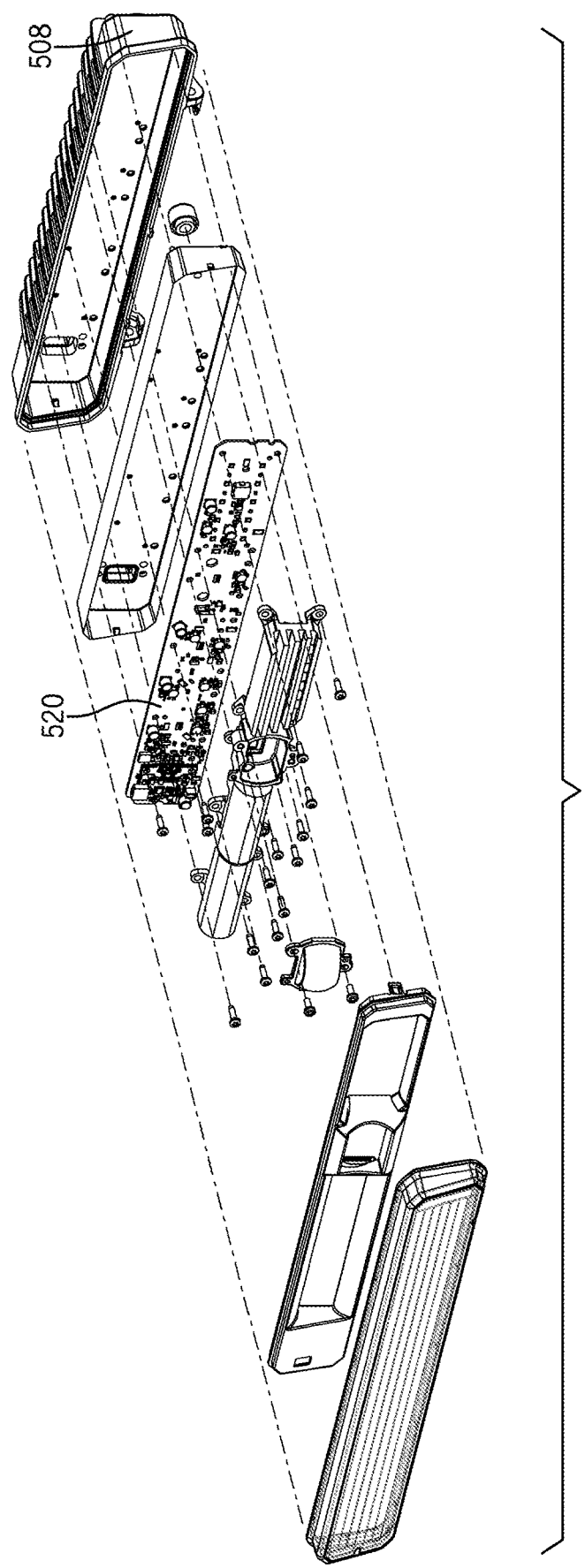
FIG. 41 is a front view of the lighting system of FIG. 40.
Figure 42:
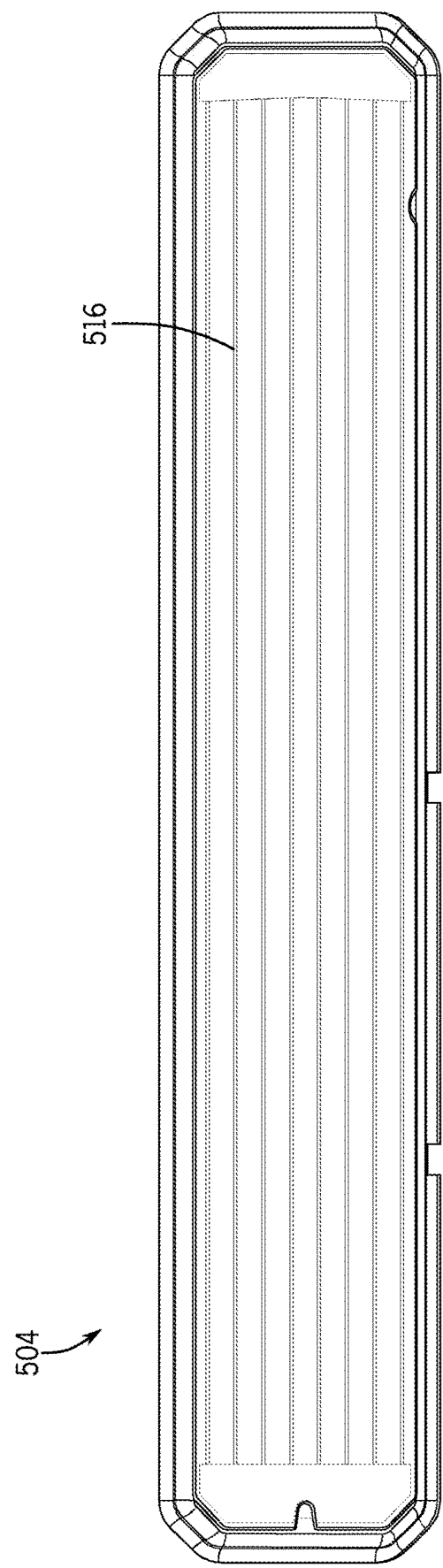
FIG. 42 is a view of an interconnect assembly, a lens, and a thermoplastic substrate of the lighting system of FIG. 40.
Figure 43:
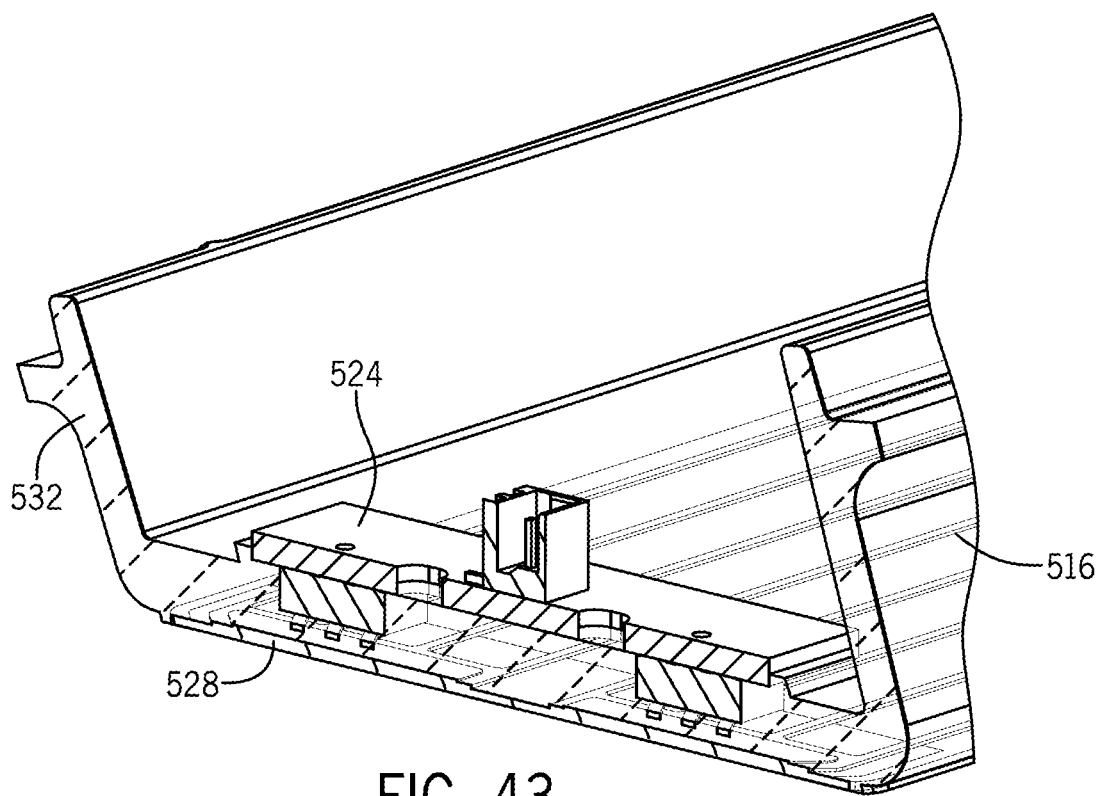
FIG. 43 is a view of an interconnect assembly, a lens, and a thermoplastic substrate of the lighting system of FIG. 40.
Figure 44:
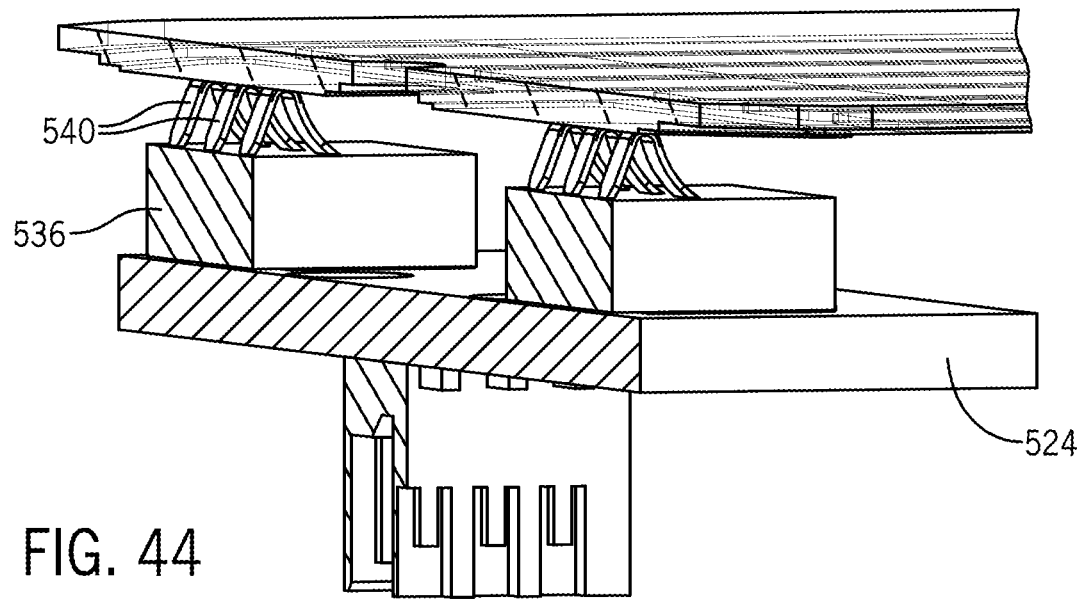
FIG. 44 is a view of the interconnect assembly and the thermoplastic substrate of the lighting system of FIG. 40.
Figure 45:
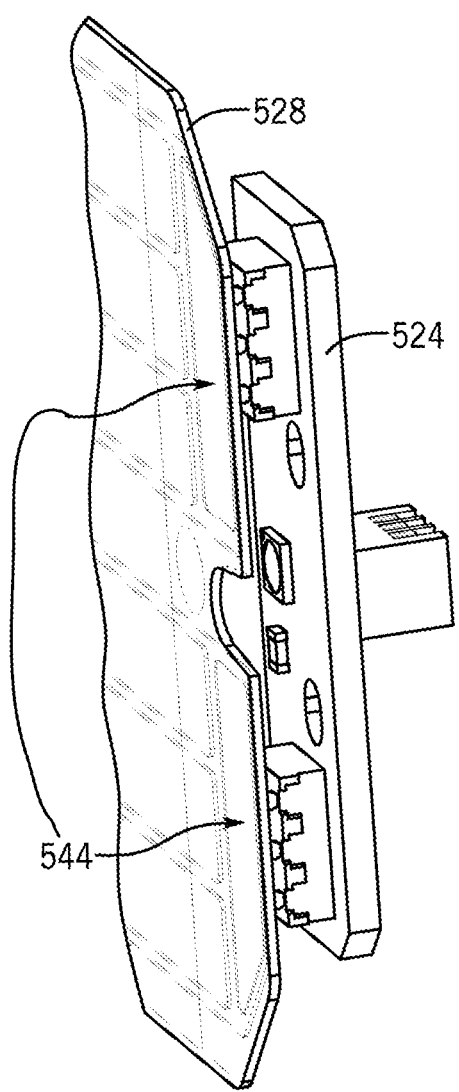
FIG. 45 is another view of the interconnect assembly and the thermoplastic substrate of the lighting system of FIG. 40.
Figure 46:
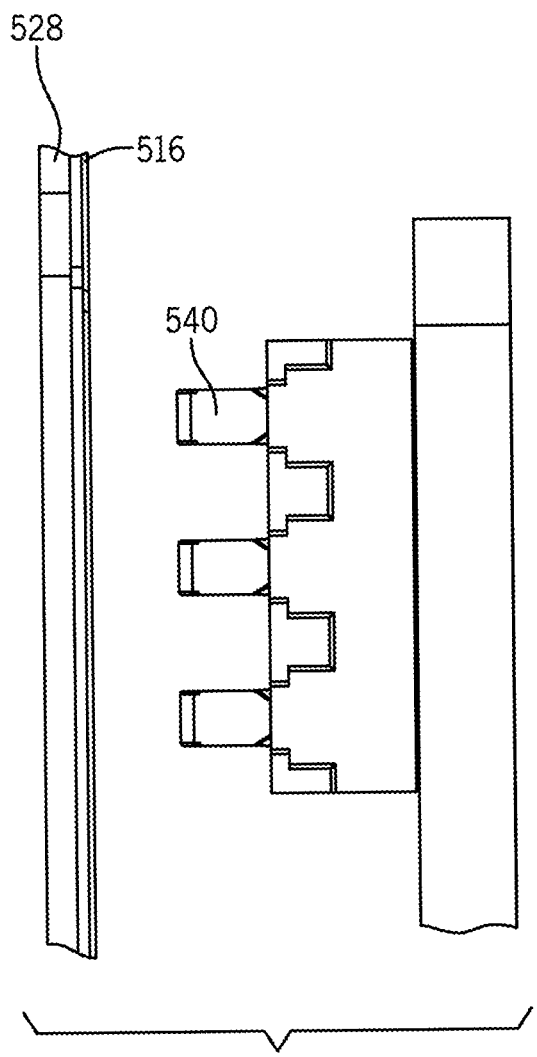
FIG. 46 is yet another view of the interconnect assembly and the thermoplastic substrate of the lighting system of FIG. 40.

Referring to FIGS. 34 and 35, an additional embodiment of a lighting system 448 is shown. The lighting system 448 can include a base 452 and a lens 462. At least one LED 456 can be positioned within the base 452 to provide illumination through the lens 462. A conductive ink or film circuit 460 can be positioned on an interior side of a thermoplastic substrate 466. The thermoplastic substrate 466 can be positioned on an exterior side of the lens 462, with the conductive ink circuit 460 facing the lens 462. A interconnect assembly 468 can be at least partially over molded by the lens 462 as described above, and be electrically coupled to the conductive ink circuit 460. The lens 462 can be bonded to at least a portion of the thermoplastic substrate 466 and the interconnect assembly 468. In some embodiments, the lens 462, the thermoplastic substrate 466, and the interconnect assembly 468 may form a single piece of construction. The interconnect assembly 468 may have spring connectors as described above for contacting the conductive ink circuit 460 and providing a suitable electrical connection for powering the conductive ink circuit 460 and thus heating the lens 462. The interconnect assembly may include and/or be coupled to portions of a driver circuit as described above and a heater circuit as described above, or be coupled to a controller configured to selectively power the conductive ink circuit 460 as described above.

Busbars 464 can be placed in contact with the spring connectors and coupled to interconnect assembly 468. The busbars 464 may have a larger cross sectional area, and thus reduced resistivity, along the length of busbars 464 as compared to the other portions of the conductive ink circuit 460 that may utilize higher resistivity in order to generate heat. The busbars 464 may include a first busbar 464a and a second busbar 464b. Depending on the electrical configuration of the interconnect assembly 468, the first busbar 464a can act as a power busbar with the second busbar 464b acting as a ground or neutral busbar. Alternatively, the first busbar 464a can act as a ground or neutral busbar with the second busbar 464b acting as a power busbar.

Referring to FIGS. 36-39, various components of another embodiment of a lighting system 472 are shown. The lighting system 472 can include a base 476 and a lens 500. At least one LED 497 can be positioned within the base 476 to provide illumination through the lens 500. A conductive ink or film circuit 480 can be positioned on an interior side of a thermoplastic substrate 496. The thermoplastic substrate 496 positioned on an exterior side of the lens 500, with the conductive ink circuit 480 facing the lens 500. The conductive ink circuit 480 can include multiple bus bars 484, each of which may be a power busbar or a neutral or ground busbar. A interconnect assembly 488 can be at least partially over molded by the lens 500 as described above, and be electrically coupled to the conductive ink circuit 480. The lens 500 can be bonded to at least a portion of the thermoplastic substrate 496 and the interconnect assembly 488, and the lens 500, the thermoplastic substrate 496, and the interconnect assembly 488 may form a single piece of construction. The interconnect assembly 488 may have spring connectors as described above for contacting the conductive ink circuit 480 and providing a suitable electrical connection for powering the conductive ink circuit 480 and thus heating the lens 500. The interconnect assembly may include and/or be coupled to portions of a driver circuit as described above and a heater circuit as described above, or be coupled to a controller configured to selectively power the conductive ink circuit 480 as described above. The lighting system 472 may power the conductive ink circuit 480 at a rate of about two watts per square inch, which may allow the lighting system 472 to be used in relatively high speed applications such as mounted on a snowplow that operates at highway speeds.

According to one non-limiting example embodiment, the lighting system 472 was subjected to testing regarding functionality at a range of temperatures as well as deicing capabilities. The testing procedure included placing a thermocouple centered on the outer surface of an outer lens, in this case, the thermoplastic substrate 496. The lighting system 472 was then orientated as it would be oriented within a vehicle (e.g., lens 500 placed near an LED light), and with the thermoplastic substrate 496 and lens 500 visible through an observation window. Thermocouple measurements and current measurements of currents supplied to the lighting system were recorded over the duration of the test. A sampling rate of the measurements was high enough to observe the temperature at which the heater turns on. The lighting system 472 was placed in a thermal chamber at 30° C. and powered on high beam and low beam at 13.5 VDC. Temperature in the chamber was ramped from 30° C. to −30° C. over a duration of one hour. The temperature in the chamber then remained at −30° C. for a duration of one hour. The lighting system 472 was then subjected to a temperature of −30° C. for one hour while a 2 mm thick layer of ice accumulated on the thermoplastic substrate 496 and/or lens 500 by occasionally applying water to the thermoplastic substrate 496 and/or lens 500. The lighting system 472 was then supplied with 13.5 VDC with high beam and low beam on. Monitoring of the ice was stopped when the ice on the lighting system 472 exhibited a steady state (defined as no change over 10 minutes), or when the lighting system 472 had been powered on for one hour. The lighting system 472 was then assessed to determine if functionality was maintained after the testing, if all ice had been cleared from the thermoplastic substrate 496 and/or lens 500, and if the lighting system 472 had sustained any damage from testing. Here, functionality was maintained, ice was cleared, and the lighting system 472 did not sustain any damage. Accordingly, the lighting system 472 was deemed to pass the testing criteria.

Referring to FIGS. 40-46, components of yet another embodiment of a lighting system 504 are shown. The lighting system 504 can include a base 508 and a lens 532. At least one LED 529 can be positioned within the base 508 to provide illumination through the lens 532. A lighting assembly 520 can be configured to provide power to the at least one LED 529. A conductive ink or film circuit 516 can be positioned on an interior side of a thermoplastic substrate 528. The thermoplastic substrate 528 can be positioned on an exterior side of the lens 532, with the conductive ink circuit 516 facing the lens 532. The conductive ink circuit 516 can include multiple bus bars 544, each of which may be a power busbar or a neutral or ground busbar. A interconnect assembly 524 can be at least partially over molded by the lens 532 as described above, and be electrically coupled to the conductive ink circuit 516. The interconnect assembly 524 can include a spring connector 536 with one or more pins 540. The pins of each spring connector 536 can be positioned to be in contact with one of the bus bars 544. The lens 532 can be bonded to at least a portion of the thermoplastic substrate 528 and the interconnect assembly 524. In some embodiments, the lens 532, the thermoplastic substrate 528, and the interconnect assembly 524 may form a single piece of construction. The interconnect assembly 524 may have spring connectors as described above for contacting the conductive ink circuit 516 and providing a suitable electrical connection for powering the conductive ink circuit 516 and thus heating the lens 532. The interconnect assembly may include and/or be coupled to portions of a driver circuit as described above and a heater circuit as described above, or be coupled to a controller configured to selectively power the conductive ink circuit 516 as described above.

According to one non-limiting example embodiment, the lighting system 504 was subjected to testing regarding functionality at a range of temperatures as well as deicing capabilities. The testing procedure included placing a thermocouple centered on the outer surface of an outer lens, in this case, the thermoplastic substrate 528. The lighting system 504 was then orientated as it would be oriented within a vehicle (e.g., lens 532 placed near an LED light), and with the thermoplastic substrate 528 and lens 532 visible through an observation window. Thermocouple measurements and current measurements of currents supplied to the lighting system were recorded over the duration of the test. A sampling rate of the measurements was high enough to observe the temperature at which the heater turned on. The lighting system 504 was placed in a thermal chamber at 30° C. and powered on high beam and low beam at 13.5 VDC. Temperature in the chamber was ramped from 30° C. to −30° C. over a duration of one hour. The temperature in the chamber then remained at −30° C. for a duration of one hour. The lighting system 504 was then subjected to a temperature of −30° C. for one hour while a 2 mm thick layer of ice accumulated on the thermoplastic substrate 528 and/or lens 532 by occasionally applying water to the thermoplastic substrate 528 and/or lens 532. The lighting system 504 was then supplied with 13.5 VDC with high beam and low beam on. Monitoring of ice was stopped when the ice on the lighting system 504 exhibited a steady state (as defined as no change over 10 minutes), or when the lighting system 504 had been powered on for one hour. The lighting system 504 was then assessed to determine if functionality was maintained after the testing, if all ice had been cleared from the thermoplastic substrate 528 and/or lens 532, and if the lighting system 504 had sustained any damage from testing. Here, functionality was maintained, ice was cleared, and the lighting system 504 did not sustain any damage. Accordingly, the lighting system 504 was deemed to pass the testing criteria.

Figure 47:
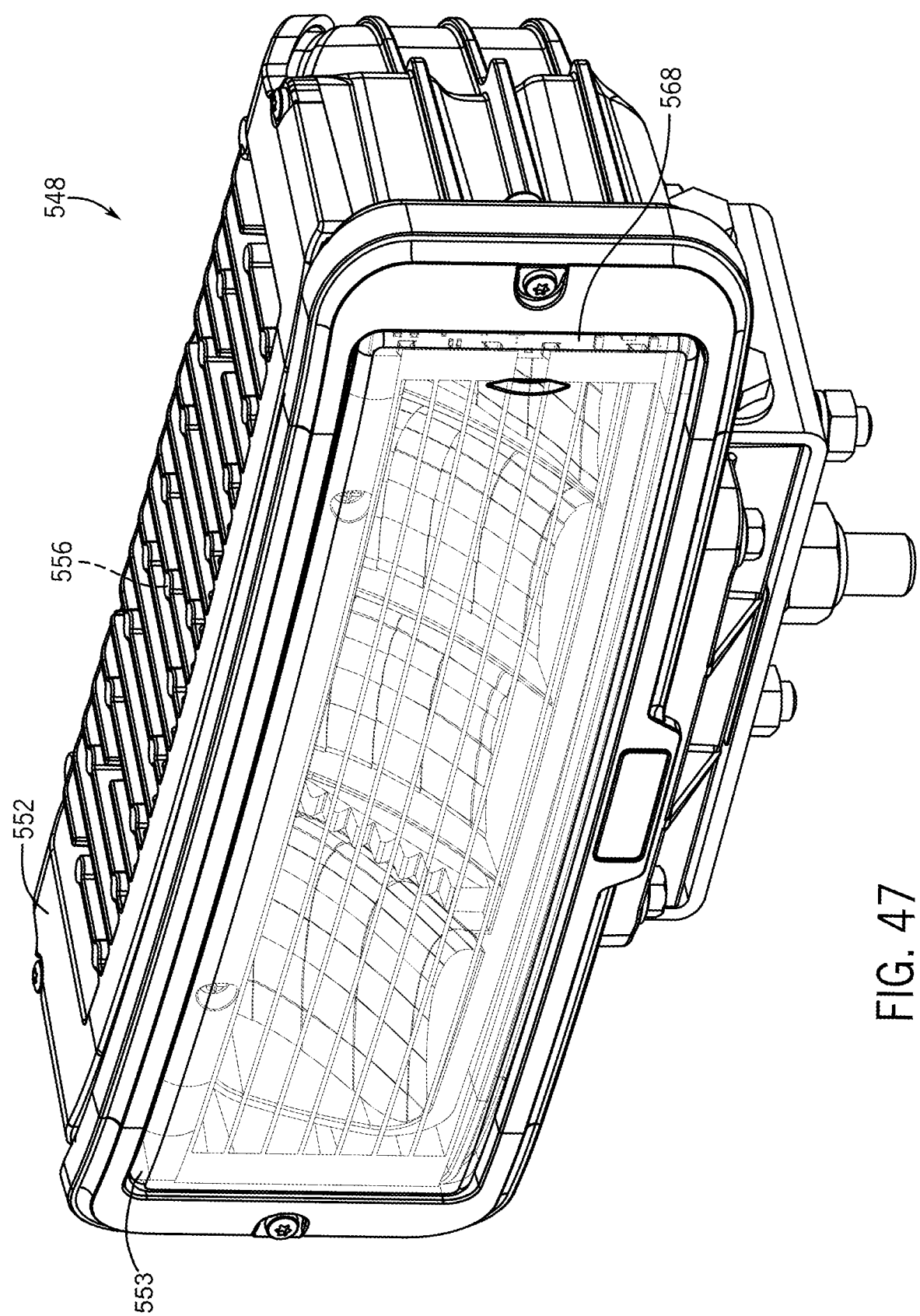
FIG. 47 is a perspective view of an alternative embodiment of a lighting system.
Figure 48:
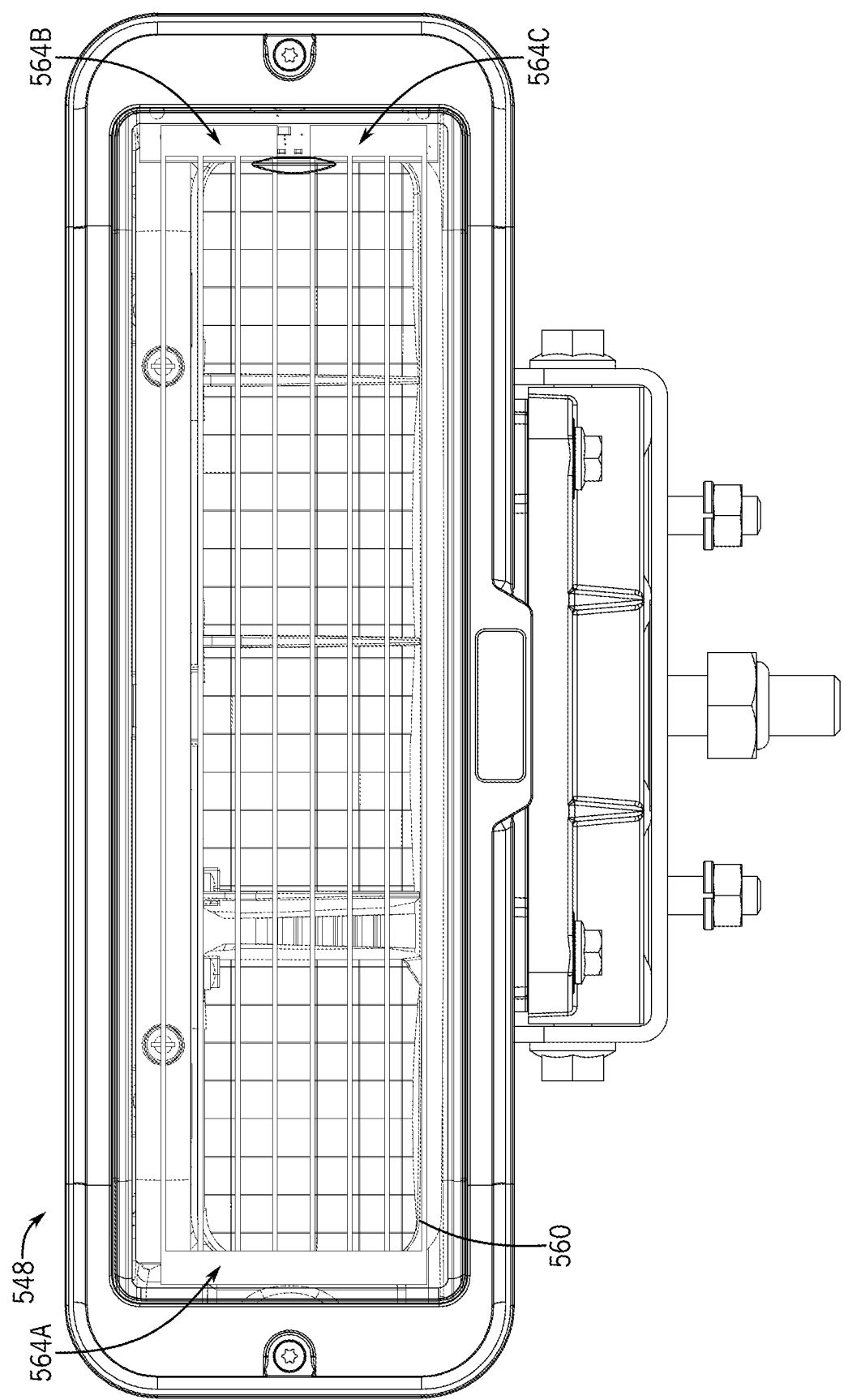
FIG. 48 is a front view of the lighting system of FIG. 47.

Referring to FIGS. 47-48, various components of another embodiment of a lighting system 548 are shown. The lighting system 548 can include a base 552 and a lens 553. At least one LED 556 can be positioned within the base 552 to provide illumination through the lens 553. A conductive ink or film circuit 560 can be positioned on an interior side of a thermoplastic substrate. The thermoplastic substrate positioned on an exterior side of the lens 553, with the conductive ink circuit 560 facing the lens 553. The conductive ink circuit 560 can include multiple busbars 564. Busbars 564B and 564C may be a power busbar or a neutral or ground busbar respectively. Busbar 564C can be a bridge busbar configured to provide a low resistance electrical connection between busbars 564B and 564C. A interconnect assembly 568 can be at least partially over molded by the lens 553 as described above, and be electrically coupled to the conductive ink circuit 560. The lens 553 can be bonded to at least a portion of the thermoplastic substrate and the interconnect assembly 568, and the lens 553, the thermoplastic substrate, and the interconnect assembly 568 may form a single piece of construction. The interconnect assembly 568 may have spring connectors as described above for contacting the conductive ink circuit 560 and providing a suitable electrical connection for powering the conductive ink circuit 560 and thus heating the lens 553. The interconnect assembly may include and/or be coupled to portions of a driver circuit as described above and a heater circuit as described above, or be coupled to a controller configured to selectively power the conductive ink circuit 560 as described above.

It is to be appreciated that the heated lighting assemblies presented in this disclosure can be used for a variety of applications in which heated lighting assemblies may perform better than non-heated lighting assemblies such as applications with vehicles operating in cold temperatures (e.g., snow plows, helicopters, snowmobiles, semi-trucks, freight and passenger trains, airplanes, ice resurfacers, etc.), applications with refrigeration systems that require lighting (e.g., industrial freezers, warehouses, lab equipment, etc.), applications with outdoor lighting in cold environments (e.g., construction sites, oil drilling platforms, various water vessels, streetlamps, heavy duty flashlights, etc.), and other lens applications associated with low temperature environments.

The present disclosure describes embodiments with reference to the Figures, in which like numbers represent the same or similar elements. Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

The described features, structures, or characteristics of the embodiments may be combined in any suitable manner in one or more embodiments. In the description, numerous specific details are recited to provide a thorough understanding of embodiments of the invention. One skilled in the relevant art will recognize, however, that the embodiments may be practiced without one or more of the specific details, or with other methods, components, materials, and so forth. In other instances, well-known structures, materials, or operations are not shown or described in detail to avoid obscuring aspects of the invention. Accordingly, the scope of the technology should be determined from the following claims and not be limited by the above disclosure.

The invention claimed is:

1. A lens heating system comprising:
    a substantially clear thermoplastic substrate;
    a conductive ink or film circuit, positioned on the thermoplastic substrate to heat the thermoplastic substrate;
    a lens heater circuit including a circuit board and a lens heater, operatively coupled to a lens heater controller, the controller configured to:
        determine a temperature associated with an outer lens surface; and
        activate the lens heater in response to a determination that the temperature is less than or equal to a threshold temperature; and
    a spring connector comprising a plurality of pins, the pins configured to couple to the conductive ink or film circuit, the pins further configured to provide an electrical connection between the pins and the conductive ink or film circuit, and the spring connector being surface-mounted to the circuit board.

2. The system of claim 1, wherein the controller is coupled to a thermistor, the thermistor configured to determine the temperature associated with the outer lens surface.

3. The system of claim 2, wherein the thermistor is a negative temperature coefficient (NTC) thermistor.

4. The system of claim 1, wherein the spring connectors are positioned at least partially within a lens coupled to the substantially clear thermoplastic substrate.

5. The system of claim 1, further comprising a second spring connector coupled to a second busbar of the conductive ink or film circuit, and wherein the spring connector is coupled to a first busbar of the conductive ink or film circuit.

6. A method for heating a lens of a lighting system, the method comprising:
    applying a conductive ink or film circuit on a substantially clear thermoplastic substrate;
    applying the conductive ink or film circuit on the substantially clear thermoplastic substrate to at least one of an interior lens side and an exterior lens side;
    positioning a spring connector comprising a plurality of pins against the conductive ink or film circuit, and establishing an electrical connection between the pins and the conductive ink or film circuit;
positioning the spring connector at least partially within the lens coupled to the substantially clear thermoplastic substrate; and
applying a controlled power to the conductive ink or film circuit to heat the lens.

7. The method of claim 6, wherein the positioning comprises:
moving the spring connector towards the conductive ink or film circuit until the pins have flexed a predetermined amount corresponding to establishing the electrical connection.

8. The method of claim 6 further comprising:
receiving a value from a wireless module; and
supplying power to the conductive ink or film circuit based on the value.

9. The method of claim 6 further comprising:
receiving a value from a speed sensor;
determining the speed value is above a predetermined threshold; and
supplying, in response to determining the speed value is above the predetermined threshold, a predetermined amount of power to the conductive ink or film circuit.

10. The method of claim 6 further comprising:
receiving a value from an optical sensor;
determining the optical value is below a predetermined threshold; and
supplying, in response to determining the optical value is below the predetermined threshold, a predetermined amount of power to the conductive ink or film circuit.

11. A heated lighting system comprising:
a substantially clear thermoplastic substrate;
a conductive ink or film circuit, positioned on the thermoplastic substrate to heat the thermoplastic substrate;
a lens in contact with the thermoplastic substrate; and
a interconnect assembly including a plurality of spring connectors, the spring connectors positioned in contact with the conductive ink or film circuit, and the interconnect assembly positioned at least partially within the lens.

12. The system of claim 11, wherein the interconnect assembly is configured to supply power to the conductive ink or film circuit.

13. The system of claim 11, wherein the lens is bonded to at least a portion of the interconnect assembly and at least a portion of the thermoplastic substrate.

14. The system of claim 11, wherein the conductive ink or film circuit is positioned on an exterior surface of the lens.

15. The system of claim 11, wherein the lens is constructed from a thermoplastic polymer.

16. A lens heating system comprising:
a substantially clear thermoplastic substrate;
a conductive ink or film circuit, positioned on the thermoplastic substrate to heat the thermoplastic substrate;
a lens heater circuit including a lens heater operatively coupled to a lens heater controller, the controller configured to:
determine a temperature associated with an outer lens surface; and
activate the lens heater in response to a determination that the temperature is less than or equal to a threshold temperature; and
a spring connector comprising a plurality of pins, the pins configured to couple to the conductive ink or film circuit, the pins further configured to provide an electrical connection between the pins and the conductive ink or film circuit,
wherein the spring connector is positioned at least partially within a lens coupled to the substantially clear thermoplastic substrate.

17. The system of claim 16, wherein the controller is coupled to a thermistor, the thermistor configured to determine the temperature associated with the outer lens surface.

18. The system of claim 17, wherein the thermistor is a negative temperature coefficient (NTC) thermistor.

19. The system of claim 16, further comprising a second spring connector coupled to a second busbar of the conductive ink or film circuit, and wherein the spring connector is coupled to a first busbar of the conductive ink or film circuit.

20. The system of claim 16, wherein the lens heater circuit further comprises a circuit board, the spring connector being surface-mounted to the circuit board.

21. A lens heating system comprising:
a substantially clear thermoplastic substrate;
a conductive ink or film circuit, positioned on the thermoplastic substrate to heat the thermoplastic substrate;
a spring connector comprising a plurality of pins, the pins configured to couple to the conductive ink or film circuit, the pins further configured to provide an electrical connection between the pins and the conductive ink or film circuit; and
a lens heater circuit including a lens heater operatively coupled to a lens heater controller, the controller configured to:
determine a temperature associated with an outer lens surface;
activate the lens heater in response to a determination that the temperature is less than or equal to a threshold temperature;
receive at least one sensor value from at least one of a speed sensor and an optical sensor;
determine the at least one sensor value is below a predetermined threshold; and
supply, in response to determining the at least one sensor value is below the predetermined threshold, a predetermined amount of power to the conductive ink or film circuit.

* * * * *

UNITED STATES PATENT AND TRADEMARK OFFICE
CERTIFICATE OF CORRECTION

PATENT NO. : 11,019,689 B2
APPLICATION NO. : 16/441514
DATED : May 25, 2021
INVENTOR(S) : Eric Deering et al.

It is certified that error appears in the above-identified patent and that said Letters Patent is hereby corrected as shown below:

In the Specification

Column 2, Line 12, "W/in 2" should be --W/in^2--.

Column 9, Line 20, "W/in 2" should be --W/in^2--.

Column 9, Line 23, "W/in 2" should be --W/in^2--.

Signed and Sealed this
Twenty-first Day of September, 2021

Drew Hirshfeld
*Performing the Functions and Duties of the
Under Secretary of Commerce for Intellectual Property and
Director of the United States Patent and Trademark Office*